United States Patent
Schloss et al.

(10) Patent No.: US 8,320,161 B2
(45) Date of Patent: Nov. 27, 2012

(54) CONDUCTIVE METAL OXIDE STRUCTURES IN NON VOLATILE RE WRITABLE MEMORY DEVICES

(75) Inventors: Lawrence Schloss, Palo Alto, CA (US); Julie Casperson Brewer, New York, NY (US); Wayne Kinney, Emmett, CA (US); Rene Meyer, Atherton, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 13/252,932

(22) Filed: Oct. 4, 2011

(65) Prior Publication Data
US 2012/0026780 A1    Feb. 2, 2012

Related U.S. Application Data

(63) Continuation of application No. 12/653,836, filed on Dec. 18, 2009, now Pat. No. 8,031,509.

(51) Int. Cl.
*G11C 11/21* (2006.01)
(52) U.S. Cl. .................................. 365/148; 365/163
(58) Field of Classification Search .................. 365/148, 365/163
See application file for complete search history.

(56) References Cited

U.S. PATENT DOCUMENTS
2003/0036215 A1 * 2/2003 Reid .............................. 438/52
* cited by examiner

*Primary Examiner* — Michael Tran
(74) *Attorney, Agent, or Firm* — Stolowitz Ford Cowger LLP

(57) ABSTRACT

A memory cell including a memory element comprising an electrolytic insulator in contact with a conductive metal oxide (CMO) is disclosed. The CMO includes a crystalline structure and can comprise a pyrochlore oxide, a conductive binary oxide, a multiple B-site perovskite, and a Ruddlesden-Popper structure. The CMO includes mobile ions that can be transported to/from the electrolytic insulator in response to an electric field of appropriate magnitude and direction generated by a write voltage applied across the electrolytic insulator and CMO. The memory cell can include a non-ohmic device (NOD) that is electrically in series with the memory element. The memory cell can be positioned between a cross-point of conductive array lines in a two-terminal cross-point memory array in a single layer of memory or multiple vertically stacked layers of memory that are fabricated over a substrate that includes active circuitry for data operations on the array layer(s).

22 Claims, 19 Drawing Sheets

CONDUCTIVE METAL OXIDE STRUCTURES IN NON VOLATILE RE WRITABLE MEMORY DEVICES

FIELD

The present invention relates generally to data storage technology. More specifically, the present invention relates to non-volatile re-writeable memory.

BACKGROUND

Data retention is a characteristic by which to measure the effectiveness of memory cells to ensure non-volatility of data stored therein. A variety of conventional memory cells structures have been developed to enhance data retention for various memory technologies, many of which are not well-suited to enhancing data retention in non-volatile re-writable memory cells including conductive oxide-based memory structures.

There are continuing efforts to improve non-volatile re-writable memory technologies.

BRIEF DESCRIPTION OF THE DRAWINGS

The invention and its various embodiments are more fully appreciated in connection with the following detailed description taken in conjunction with the accompanying drawings, in which.

Figure 1:
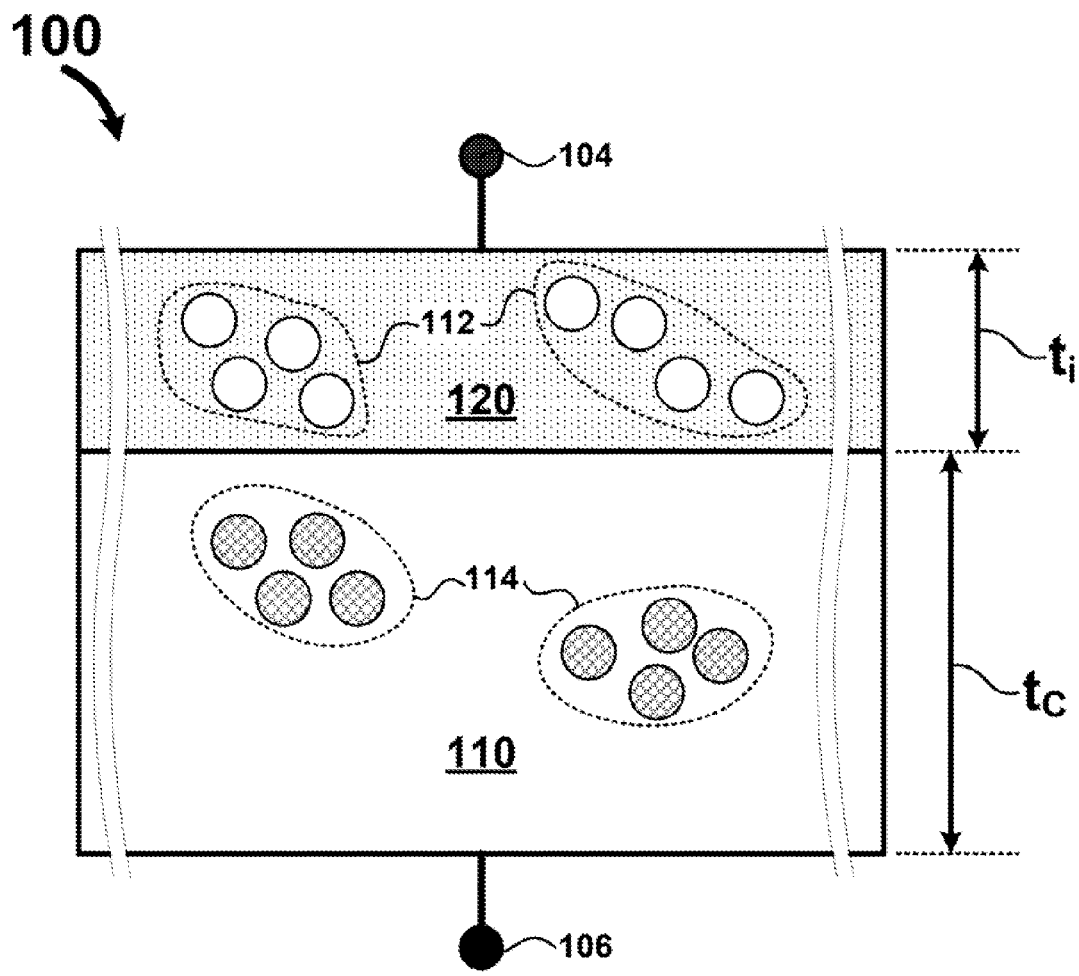
FIG. 1 depicts a cross-sectional view and a schematic view of a memory cell according to various embodiments of the invention.
Figure 1:
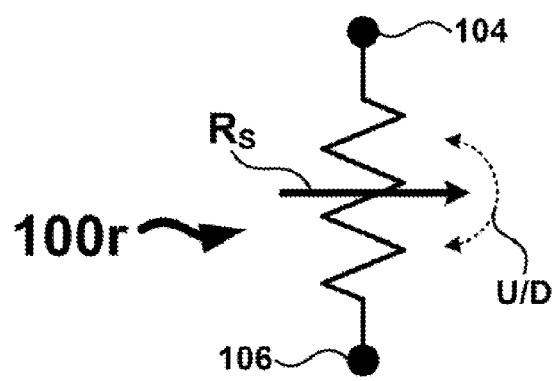

Although the above-described drawings depict various examples of the invention, the invention is not limited by the depicted examples. It is to be understood that, in the drawings, like reference numerals designate like structural elements. Also, it is understood that the drawings are not necessarily to scale.

DETAILED DESCRIPTION

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, now U.S. Published Application No. 2006/0171200 A1, and entitled "Memory Using Mixed Valence Conductive Oxides," is hereby incorporated by reference in its entirety for all purposes and describes non-volatile third dimensional memory elements that may be arranged in a two-terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide in some embodiments, as well as multiple mixed valence conductive oxide structures in other embodiments. A voltage drop across the electrolytic tunnel barrier can cause an electrical field within the mixed valence conductive oxide that is strong enough to move oxygen ions out of a mixed valence conductive oxide, according to some embodiments.

In some embodiments, an electrolytic tunnel barrier and one or more mixed valence conductive oxide structures do not need to operate in a silicon substrate, and, therefore, can be fabricated above circuitry being used for other purposes. Further, a two-terminal memory element can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½-VW1 to the Y-direction line), the memory cell can switch to a low resistive state. When a second write voltage, VW2, is applied across the memory cell (e.g., by applying ½ VW2 to the X-direction line and ½-VW2 to the Y-direction line), the memory cell can switch to a high resistive state. Memory cells using electrolytic tunnel barriers and mixed valence conductive oxides can have VW1 opposite in polarity from VW2.

FIG. 1 depicts a memory element for implementation in a memory array, according to various embodiments of the invention. In this example, memory cell 100 is depicted to include a first terminal 104 and a second terminal 106. As used herein, the term "memory cell" can refer, at least in some embodiments, to various layers of materials, including memory material(s), arranged between conductive lines (e.g., conductive array lines in a cross-point array). The various layers of materials can also include a top terminal (or electrode) and a bottom terminal (or electrode). Furthermore, some or all of the layers of material may be patterned (i.e., discrete etched layers) or a portion of the layers may be continuous (e.g., un-etched layers) across a plurality of adjacent memory cells as disclosed in U.S. Pat. No. 7,742,323, issued on Jun. 22, 2010, and titled "Continuous Plane Of Thin-Film Materials For A Two-Terminal Cross-Point Memory", which is incorporated herein by reference in its entirety for all purposes. In FIG. 1, the layers 110 and 120 may be discrete layers that have been deposited as a thin film and subsequently etched to form discrete layers depicted or the layers 110 and 120 may be continuous layers that are not etched as will be described below in reference to FIG. 6D. Memory cell 100 includes a conductive metal oxide (CMO) 110 and an electrolytic insulator 120 in contact with and electrically in series with the CMO 110. The CMO 110 and the electrolytic insulator 120 are electrically in series with the first terminal 104 and the second terminal 106. As will be described below, the terminals 104 and 106 may represent one or more electrically conductive structures operative to electrically communicate voltages for data operations to the memory cell 100, including but not limited to electrodes, glue layers, adhesion layers, and portions of conductive array lines, for example. In various embodiments, electrolytic insulator 120 can be formed either above or below CMO 110. In at least some embodiments, electrolytic insulator 120 is an electronic insulator and an ionic electrolyte, as a medium, that provides an ion transport mechanism between positive and negative potentials applied to terminals 104 and 106. In at least some embodiments, electrolytic insulator 120 can be an electrolytic tunnel barrier layer configured to provide for tunneling, which can include, but is not limited to, single step tunneling processes (e.g., direct tunneling, Fowler-Nordheim tunneling, and thermionic field emission tunneling), multi-step tunneling processes (e.g., trap-assisted tunneling), and the like. The electrolytic insulator 120 can be made from materials including but not limited to rare earth oxides, rare earth metal oxides, yttria stabilized zirconia (YSZ), yttrium oxide ($Y_2O_3$), zirconium oxide ($ZrO_X$), also referred to as zirconia (e.g., $ZrO_2$), hafnium oxide ($HfO_X$), gadolinium oxide ($GdO_X$), lanthanum aluminum oxide ($LaAlO_X$), erbium oxide ($ErO_X$) (e.g., $Er_2O_3$), and the like.

Electrolytic insulator 120 can be configured to accumulate ions, and CMO 110 can be configured to serve as an ion supply. Accordingly, CMO 110 includes mobile ions 114 that can be transported from the CMO 110 to the electrolytic insulator 120 in response to a first electric field (not shown) of sufficient magnitude and transported back from the electrolytic insulator 120 to the CMO 110 in response to a second electric field (not shown) of sufficient magnitude as will be described below. The electrolytic insulator 120 can include interstitial sites or vacancies 112 (vacancies 112 hereinafter) operative to receive mobile ions 114 that are transported into the electrolytic insulator 120 in response to the first electric field. The number of mobile ions 114 and vacancies 112 will not be necessarily be equal and will depend in part on the materials selected, their thickness, just to name a few. As one example, the mobile ions may be oxygen ($O^-$) ions that have a negative charge. CMO 110 includes a thickness $t_C$ and electrolytic insulator 120 includes a thickness $t_i$. Actual values for the thicknesses will be application dependent; however, for tunneling to occur at voltage levels that can be generated by circuitry (e.g., CMOS technology) operative for data operations to the memory cell 100 (e.g., read and write operations), the thickness $t_i$ will be approximately 50 Å or less. Typically, thickness $t_i$ is substantially less than the thickness $t_C$ (e.g., $t_i \ll t_C$). For example, thickness $t_i$ can be in a range from about 5 Å to about 35 Å and thickness $t_C$ can be in a range from about 100 Å to about 350 Å. Preferably, thickness $t_C$ is less than about 100 Å. In FIG. 1, the memory cell 100 is operative to store data as a plurality of conductivity profiles that can be non-destructively determined by applying a read voltage across the terminals 104 and 106. The application of the read voltage generates a read current and a magnitude of the read current is indicative of the value of the stored data. The conductivity profiles can represent resistive states that can be reversibly switched by applying a write voltage across the terminals 104 and 106. For example, a high value of resistance can represent a logic "0" (e.g., a programmed state≈1 MΩ) and a low value of resistance can represent a logic "1" (e.g., an erased state≈100 kΩ). For purposes of illustration, the memory cell may be electrically modeled as a variable resistance 100r having a resistance $R_S$ that can be reversibly modulated up and down U/D by write voltages having sufficient magnitude and polarity that are applied across terminals 104 and 106. The write voltage generates an electric field in layers 110 and 120 operative to move the ions 114 from the CMO 110 to the insulator 120 or from the insulator 120 to the CMO 110. Therefore, the movement of ions between electrolytic insulator 120 and CMO 110 can modify the electronic conductivity profile of CMO 110 by either increasing electronic conductivity as a function of the ionic conduction in one direction, or decreasing electronic conductivity as a function of the ionic conduction in another direction. For example, ion conduction can cause the electronic conductivity of CMO 110 to either increase or decrease in terms of the values of conductivity. In at least some embodiments, CMO 110 can include non-perovskite structures (e.g., a Ruddlesden-Popper structure). In at least some embodiments, CMO 110 can include a non-traditional perovskite structure (e.g., a multiple B-site perovskite structure). In at least some embodiments, CMO 110 can include conductive binary oxide structures. In at least some embodiments, CMO 110 can include pyrochlore oxide structures. The CMO 110 can have a crystalline structure or an amorphous structure. Examples of crystalline structures for the CMO 110 include but are not limited to a single crystalline structure, a polycrystalline structure, a multi-phase crystalline structure, a mixed-phase crystalline structure, a columnar crystalline structure, and a micro crystalline structure.

In view of the foregoing, the structures and/or functionalities of memory cell 100 can enhance data retention, among other things. In at least some embodiments, CMO 110 can provide for a mechanism by which conductivity modification in memory cell 100 can occur separate from, or in addition to, a conductivity modification mechanism provided with the interaction of electrolytic insulator 120. In at least some embodiments, ionic conduction may or may not be complemented by electron conduction, whereby holes and electrons (e.g., electron-hole pairs) move within memory cell 100 to facilitate conductivity modification of memory cell 100. These conduction mechanisms, in turn, can increase a sensing window with which to read data (or a datum) stored in memory cell 100.

In at least some embodiments, CMO 110 can be formed from a material having a conductivity a that may be proportional to a quantity q of ions I (e.g., q(I)) in CMO 110, such that σ≈f(q(I)). The term "ions" in the context of "quantity of ions" can generally refer, at least in some embodiments, to ions that are available to participate in ionic conduction, such as mobile ions 114. In operation, a potential difference applied across terminal 104 and terminal 106 can give rise to an electric field in a first direction. In this case, the electric field promotes ionic conduction such that ions 114, which can be described as mobile ions, are transported in a direction that moves ions from CMO 110 to electrolytic insulator 120 (e.g., ions 114 move into ion vacancies 112). Under the electric field in the first direction, ions 114 are transported to ion vacancies 112 in electrolytic insulator 120. As ions 114 leave CMO 110 and ion vacancies 112 are filled in electrolytic insulator 120, the electronic conductivity of CMO 110 decreases. Ionic conduction in this direction (i.e., a direction of travel that is opposite that of the electric filed in the first direction) facilitates transitioning CMO 110 to an ion-deficient state, as well as transitioning electrolytic insulator 120 to an accumulated ion state (e.g., an ion-rich state).

Conversely, another potential difference applied between terminal 104 and terminal 106 can give rise to an electric field in a second direction. In this case, the electric field promotes ionic conduction such that ions are transported in a direction that moves ions from electrolytic insulator 120 to CMO 110. For example, under the electric field in a second direction, ions 114 that occupy vacancies 112 in electrolytic insulator 120 are transported to ion vacancies that were created in CMO 110 by the departure of the ion 114. As ions 114 leave electrolytic insulator 120 and return to CMO 110, the quantity of ions 114 entering the CMO 110 can cause the conductivity to increase. Thus, ionic conduction in this direction (e.g., direction of travel that is opposite the electric field in the second direction) facilitates transitioning CMO 110 out of an ion-deficient state, as well as transitioning electrolytic insulator 120 out of an accumulated ion state. In some embodiments, the aforementioned potential differences can be implemented to program and erase data (or a datum) in memory cell 100. Other potential differences can be applied, such as during a read operation, that are different than the aforementioned potential differences (e.g., read voltages having magnitudes that are less than write voltages used to program or erase the memory cell 100), and are non-destructive to data previously stored in memory cell 100.

Figure 1A:
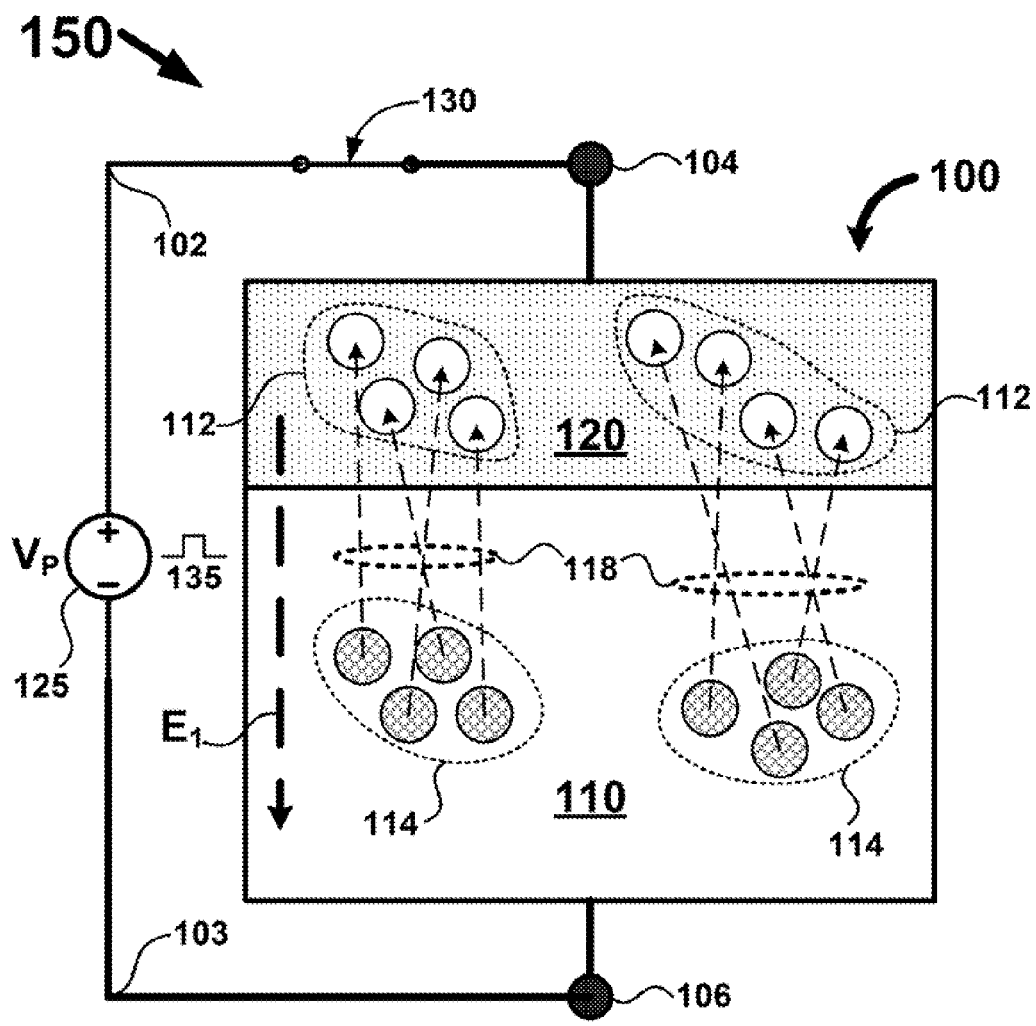
FIG. 1A depicts a cross-sectional view of ion motion in response to a programming voltage applied across a memory cell.

Reference is now made to FIG. 1A where a configuration 150 depicts a voltage source 125 electrically coupled (102, 103) with terminals (104, 106) via a switch 130 depicted as being closed so that a programming voltage $V_P$ is applied across the terminals (104, 106). The programming voltage $V_P$ may be applied as a voltage pulse 135. Although a single voltage source 125 is depicted, the programming voltage $V_P$ may be applied by separate voltage sources, one electrically coupled with terminal 104 and the other electrically coupled with terminal 106. The voltage source(s) and associated circuitry and interconnect structures may be positioned on a substrate the memory cell 100 is fabricated over. A magnitude and polarity of the programming voltage $V_P$ is operative to generate a first electric field $E_1$ in a direction depicted by a dashed arrow. For purposes of explanation, assume mobile ions 114 are negatively charged so that in response to the first electric field $E_1$, at least a portion of the ions 114 in CMO 110 are transported 118 to the electrolytic insulator 120 where at least a portion of those ions 114 enter vacancies 112.

Figure 1B:
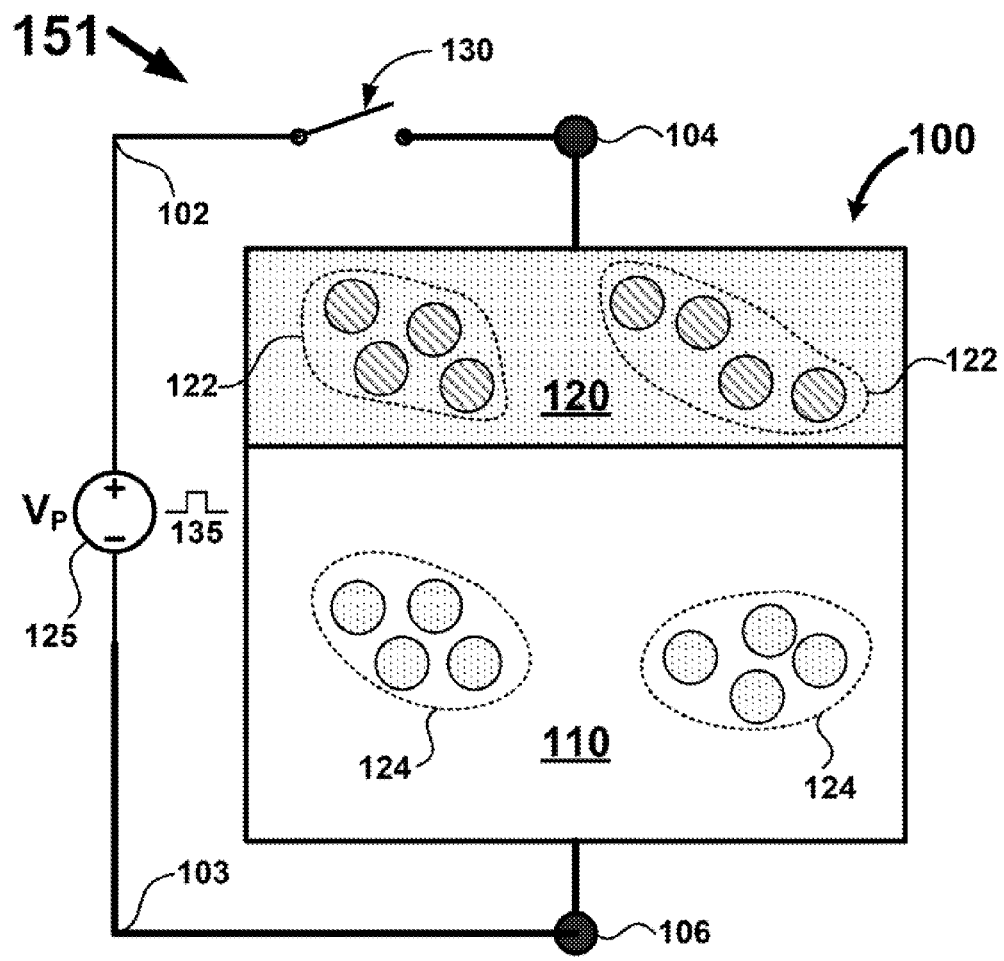
FIG. 1B depicts a cross sectional view and a schematic view of a memory cell after a programming voltage has been applied.
Figure 1B:
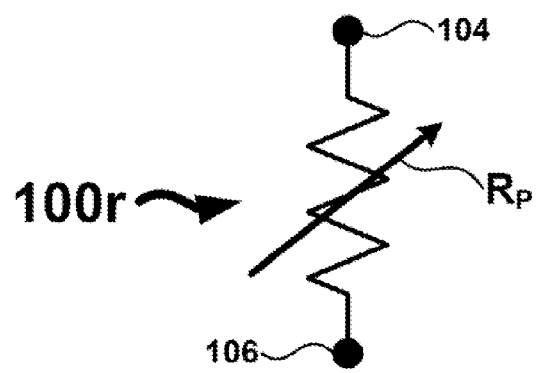

Turning now to FIG. 1B, a configuration 151 depicts the switch 130 as open such that the programming voltage $V_P$ is no longer applied across terminals (104, 106). The transport of ions 114 from CMO 110 has created vacancies 124 in the CMO 110, Furthermore, vacancies 112 in the electrolytic insulator 120 that received the mobile ions 114 have become occupied vacancies 122. As was described above, the transport of the ions 114 creates an ion deficient state in the CMO 110 that changes the conductivity profile of the CMO 110. Here, the electrical model for variable resistance 100r models the ion deficient state as a decrease in conductivity of the CMO 110 such that the resistance $R_S$ (see FIG. 1) is modulated upward and increases to a resistance $R_P$ indicative of the programmed state of memory cell 100 (e.g., a high resistance in the programmed state).

Figure 1C:
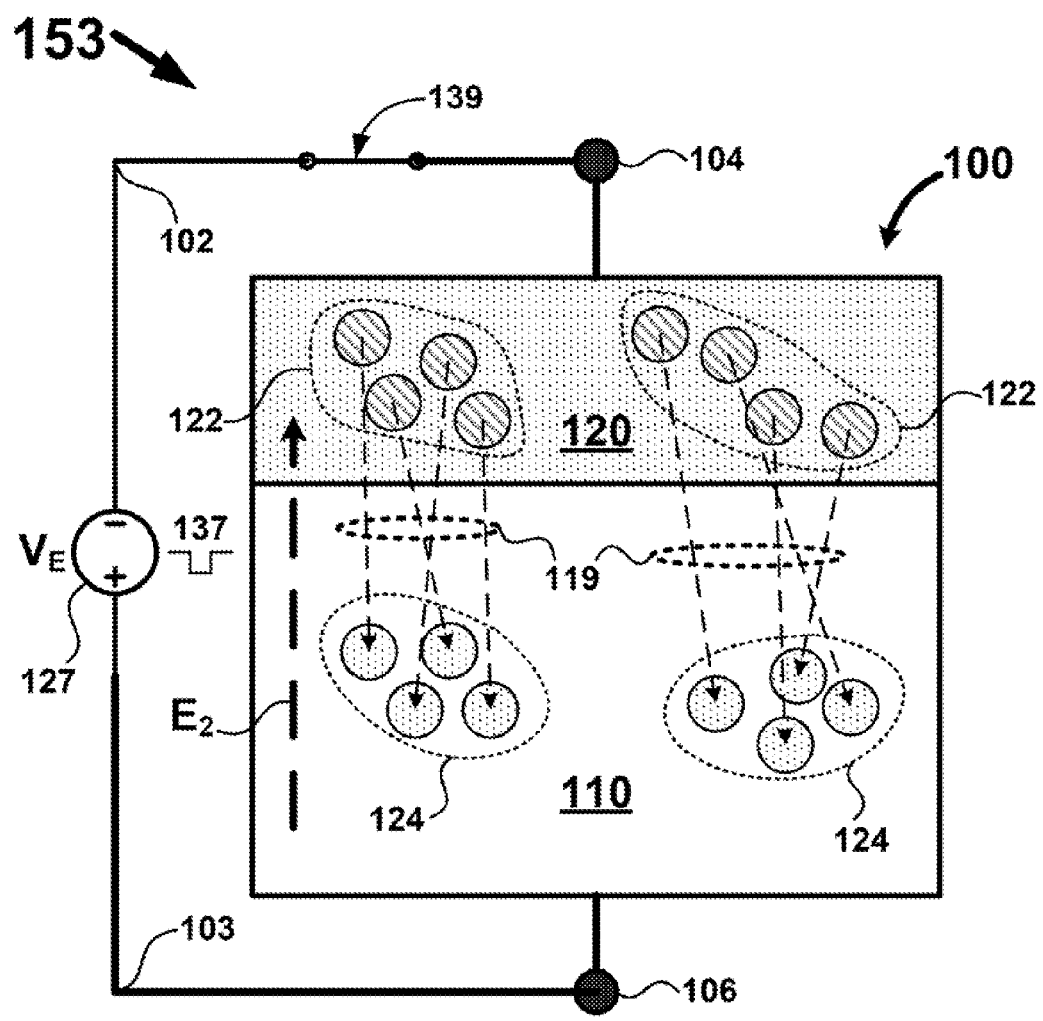
FIG. 1C depicts a cross-sectional view of ion motion in response to an erase voltage applied across a memory cell.

Moving on to FIG. 1C, a configuration 153 depicts a voltage source 127 electrically coupled (102, 103) with terminals (104, 106) via a switch 139 depicted as being closed such that an erase voltage $V_E$ is applied across the terminals (104, 106). The erase voltage $V_E$ may be applied as a voltage pulse 137. A magnitude and polarity of erase voltage $V_E$ is operative to generate a second electric field $E_2$ that is opposite in direction to the first electric field $E_1$ (see FIG. 1A). In response to the second electric field $E_2$, at least a portion of the mobile ions 114 positioned in occupied vacancies 122 are transported 119 back to the CMO 110 and into vacancies 124.

Figure 1D:
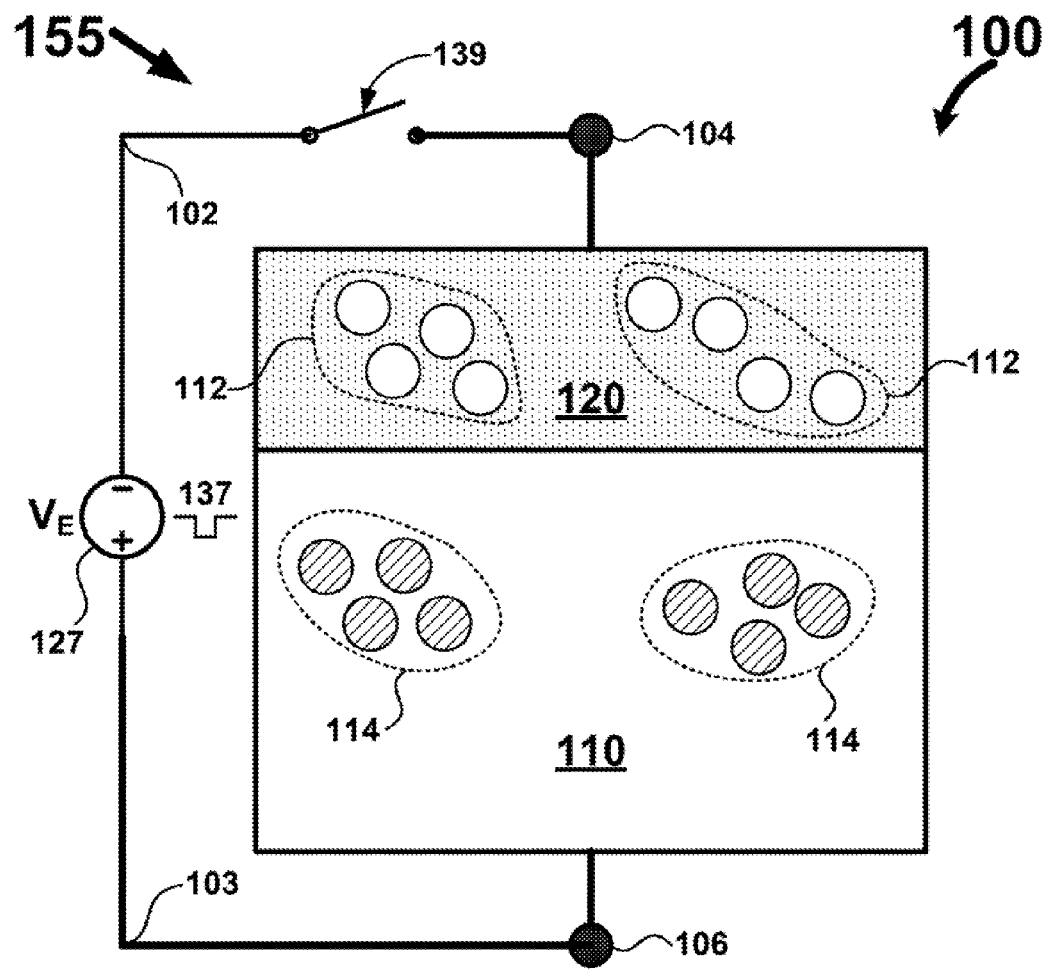
FIG. 1D depicts a cross sectional view and a schematic view of a memory cell after an erase voltage has been applied.
Figure 1D:
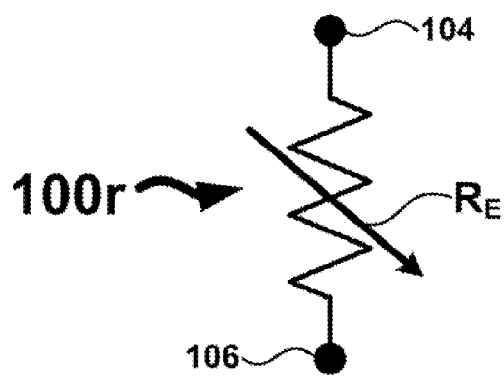

Referring now to FIG. 1D, a configuration 155 depicts the switch 139 as open such that the erase voltage $V_E$ is no longer applied across terminals (104, 106). The transport 119 of the ions 114 back into the CMO 110 has transitioned the CMO 110 from the ion deficient state of FIG. 1B to an ion rich state. Consequently, changing the conductivity profile of memory cell 100. Here, the electrical model for variable resistance 100r models the ion rich state as an increase in conductivity of the CMO 110 such that the resistance $R_S$ (see FIG. 1) is modulated downward and decreases to a resistance $R_E$ indicative of the erased state of memory cell 100 (e.g., a low resistance in the erased state).

As will be described in greater detail below, one criteria for selecting the materials for the CMO 110 and the electrolytic insulator 120 is data retention, that is, a measure of the ability of the memory cell 100 to retain stored data over time, such that conductivity values that are indicative of stored data do not substantially drift over time and the stored data can be reliably read during a read operation. Another criteria is memory effect, a measure of the difference in read current magnitudes for different states of stored data (e.g., a logic "0" vs. a logic "1"). The larger the difference, the easier it is for sense circuitry to accurately determine if data read is indicative of the memory cell 100 being in a programmed state or an erased state. Essentially, the larger the difference, the higher the signal-to-noise ratio (S/N). In regards to FIG. 1B, data retention can be explained as the ions 114 remaining in occupied vacancies 122 in the absence of power (e.g., a write voltage applied across terminals 104 and 106) and when a read voltage is applied across terminals 104 and 106. Typically, a magnitude of the read voltage is less than a magnitude of the write voltage (e.g., $V_P$ and $V_E$). Accordingly, a magnitude of an electric field generated by the read voltage is insufficient to transport the ions 114 from their respective occupied vacancies 122 and resistance $R_P$ does not change over time. Similarly, in regards to FIG. 1D, data retention can be explained as the ions 114 remaining in CMO 110 in the absence of power and when the read voltage is applied across terminals 104 and 106. Consequently, resistance $R_E$ does not change over time.

Figure 2A:
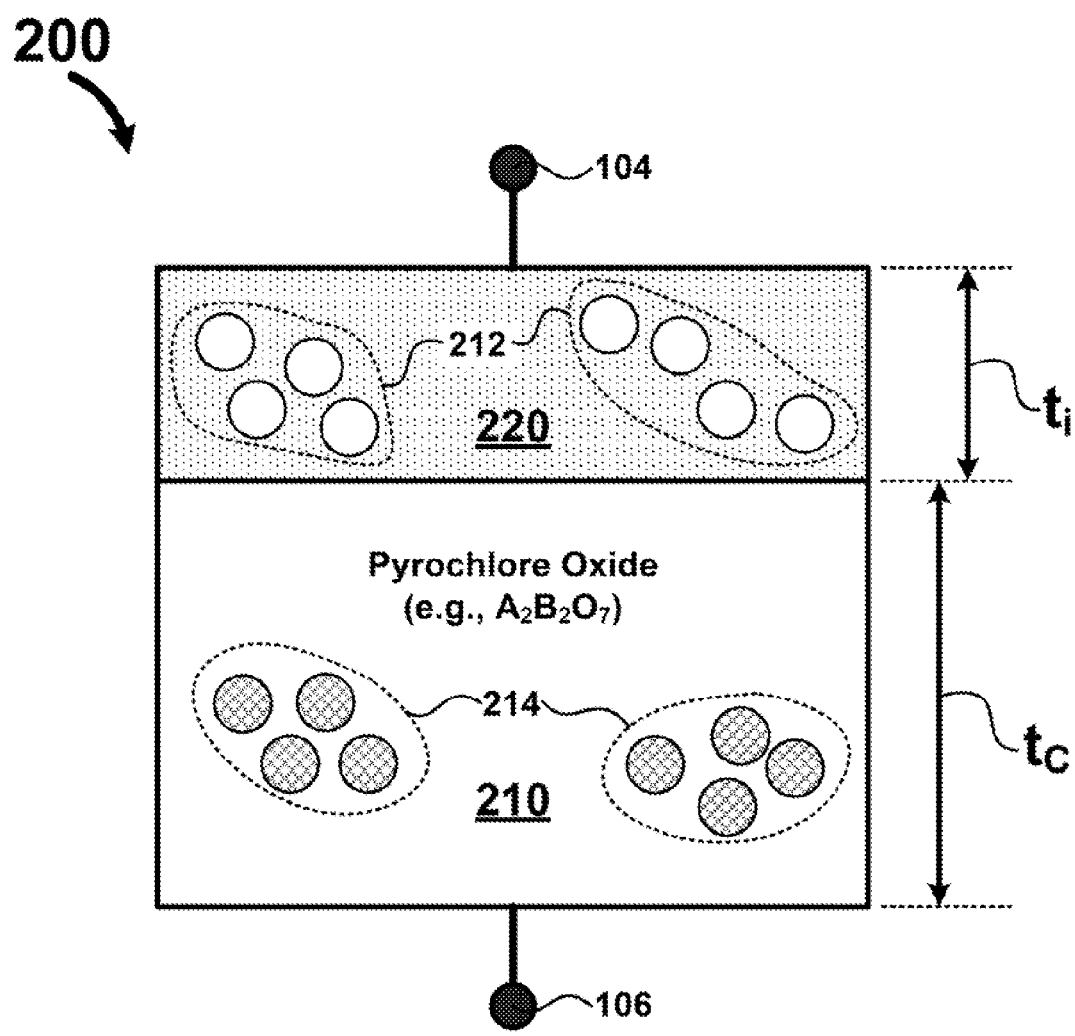
FIG. 2A depicts an example of a memory cell that includes a pyrochlore oxide material according to at least some embodiments of the invention.

Reference is now made to FIG. 2A which depicts an example of a memory cell 200 that includes a pyrochlore oxide material 210 as the conductive metal oxide, according to at least some embodiments of the invention. As shown, FIG. 2A depicts an electrolytic insulator 220 and a pyrochlore oxide material 210 as the conductive metal oxide 110 of FIG. 1. The CMO for the layer 210 crystallizes in a pyrochlore oxide structure, also referred to as a pyrochlore oxide phase. For example, the layer 210 can have a crystalline structure. Both electrolytic insulator 220 and the pyrochlore oxide material 210 are in contact with each other and are electrically in series with each other and with the terminals 104 and 106. Pyrochlore oxide material 210 can have an oxygen-deficient state and can be configured to promote ion conduction by, for example, using dopants that facilitate conduction of oxygen ions 214. As used herein, the term "pyrochlore material" can refer, at least in some embodiments, to metal oxides having a structure that is the same as or is similar to the mineral pyrochlore, and/or can be described as having the general form $A_2B_2O_7$, or any variants thereof. The A and B sites generally include, for example, rare-earth or transition metal elements, and O represents oxygen. As one example, A can represent at least one element including but not limited to a rare earth element, barium (Ba), strontium (Sr), lead (Pb), bismuth (Bi), and potassium (K). As another example, B can represent a rare earth element or a transition metal element. As was described above, the first electric field $E_1$ can be operative to transport the mobile oxygen ions 214 to electrolytic insulator 220 where those ions occupy vacancies 212. The second electric field $E_2$ can be operative to transport the mobile oxygen ions 214 from occupied vacancies (not shown) in the electrolytic insulator 220 back into vacancies (not shown) in the pyrochlore oxide material 210. The thickness $t_i$ and $t_C$ for the layers 220 and 210 respectively, will be application dependent.

Figure 2B:
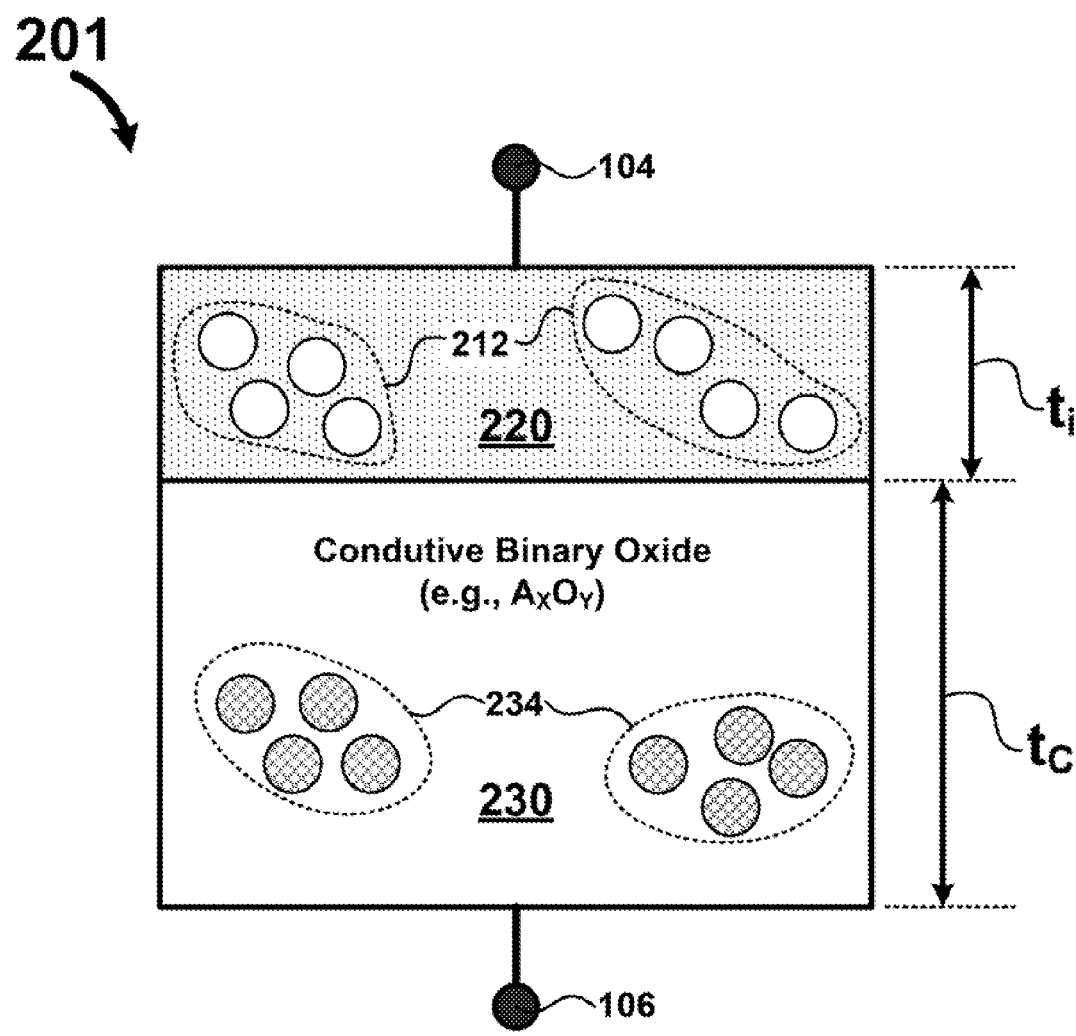
FIG. 2B depicts a memory cell implementing a conductive binary oxide according to at least some embodiments of the invention.

Moving on to FIG. 2B, a memory cell 201 implementing a conductive binary oxide as an example of the CMO 110 of FIG. 1 is depicted, according to at least some embodiments of the invention. In this example, memory cell 201 includes a conductive binary oxide structure 230 (e.g., as an ion reservoir) in contact with an electrolytic insulator 220 and disposed between terminals 104 and 106, across which potential differences can be applied. The conductive binary oxide structure 230 and the electrolytic insulator 220 are electrically in series with each other and the terminals 104 and 106. Conductive binary oxide structure 230 can be any metal oxide having the form $A_XO_Y$, where A represents a metal and O represents oxygen. The conductive binary oxide structure 230 may be doped to obtain the desired conductive properties for a CMO. For example, depending on the material selected for the layer 230, elements including but not limited to niobium (Nb), fluorine (F), and nitrogen (N) can be used as dopants to alter the conductivity of the layer 230. As one example, doping can be accomplished using a co-sputtering process that is well understood in the microelectronics art. In at least one embodiment, conductive binary oxide structure 230 has a conductivity that is lower in an oxygen-deficient state. In at least some embodiments, the conductivity of conductive binary oxide structure 230 can be configured to promote electronic conduction (e.g., electron-hole pair movement) in addition to ionic conduction of oxygen ions 234. The electrolytic insulator 220 can be made from materials including but not limited to an electrically insulating high-k dielectric material, rare earth oxides, rare earth metal oxides, yttria stabilized zirconia (YSZ), yttrium oxide ($Y_2O_3$), zirconium oxide ($ZrO_X$), also referred to as zirconia (e.g., $ZrO_2$), hafnium oxide ($HfO_X$), gadolinium oxide ($GdO_X$), erbium oxide ($ErO_X$) (e.g., $Er_2O_3$), and the like. As was described above, electrolytic insulator 220 includes vacancies 212. In at least one embodiment, a conductive binary oxide structure 230 can be formed directly in contact with a YSZ structure as electrolytic insulator 220. In view of the foregoing, conductive binary oxide structure 230 can be implemented as a source of ions to promote conduction (e.g., ionic and/or electronic) rather than otherwise might be the case (e.g., such as using a conductive binary oxide as an insulator to reduce and/or inhibit conduction). The conductive binary oxide structure 230 includes a crystalline structure.

Figure 3A:
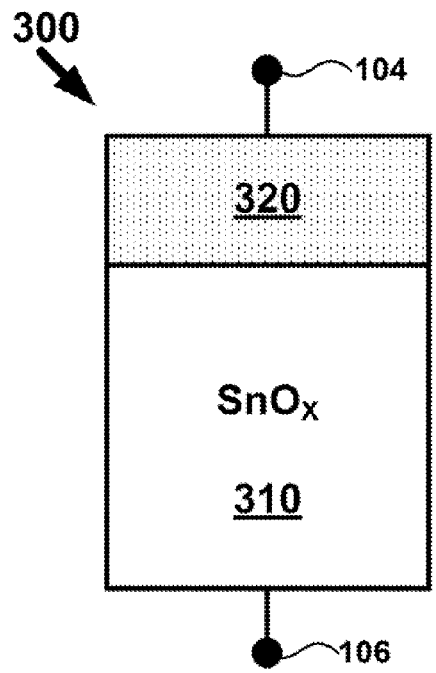
FIG. 3A depicts one example of a memory cell implemented using a conductive binary oxide according to various embodiments of the invention.
Figure 3B:
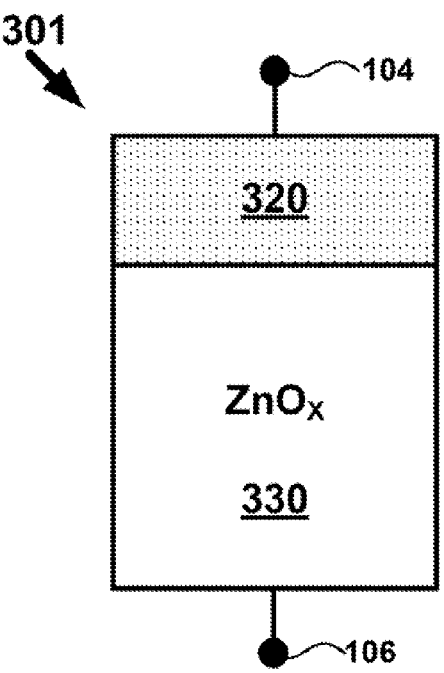
FIG. 3B depicts another example of a memory cell implemented using a conductive binary oxide according to various embodiments of the invention.
Figure 3C:
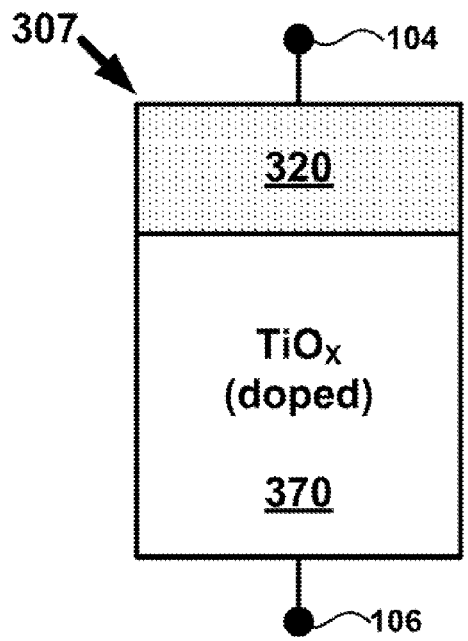
FIG. 3C depicts yet another example of a memory cell implemented using a conductive binary oxide according to various embodiments of the invention.

FIGS. 3A through 3C depict examples of memory cells implementing conductive binary oxides as the CMO 110 of FIG. 1, according to various embodiments of the invention. In the example shown in FIG. 3A, a memory cell 300 includes an electrolytic insulator 320 and a tin oxide ($SnO_X$) (e.g., $SnO_2$) material 310 as a conductive binary oxide structure, both electrolytic insulator 320 and tin oxide material 310 are in contact with and electrically in series with each other and are disposed between terminals 104 and 106 and are electrically in series with terminals 104 and 106. In the examples shown in FIGS. 3B through 3E, memory elements 301 and 307 include a zinc oxide ($ZnO_X$) (e.g., $ZnO_2$) material 330 and a doped titanium oxide (TiO$_X$) (e.g., TiO$_2$) material 370, respectively, as conductive binary oxide structures that are in contact with and electrically in series with their respective electrolytic insulator layers 320 and are disposed between terminals 104 and 106 and electrically in series with those terminals. As was described above in reference to FIGS. 1A through 1D, the application of voltage V$_P$ is operative to transport mobile ions (not shown) from conductive binary oxide CMO layers 310, 330, and 370 and into their respective electrolytic insulator layers 320 and the application of voltage V$_E$ is operative to move the mobile ions from the vacancies they occupied in the electrolytic insulator layer 320 and back into the CMO layers 310, 330, and 370. In FIG. 3C, the titanium oxide (TiO$_X$) material 370 can be doped with a material including but not limited to niobium (Nb). The doping of the titanium oxide (TiO$_X$) can be accomplished by a process including but not limited to co-sputtering during deposition of the layer 370.

Figure 4:
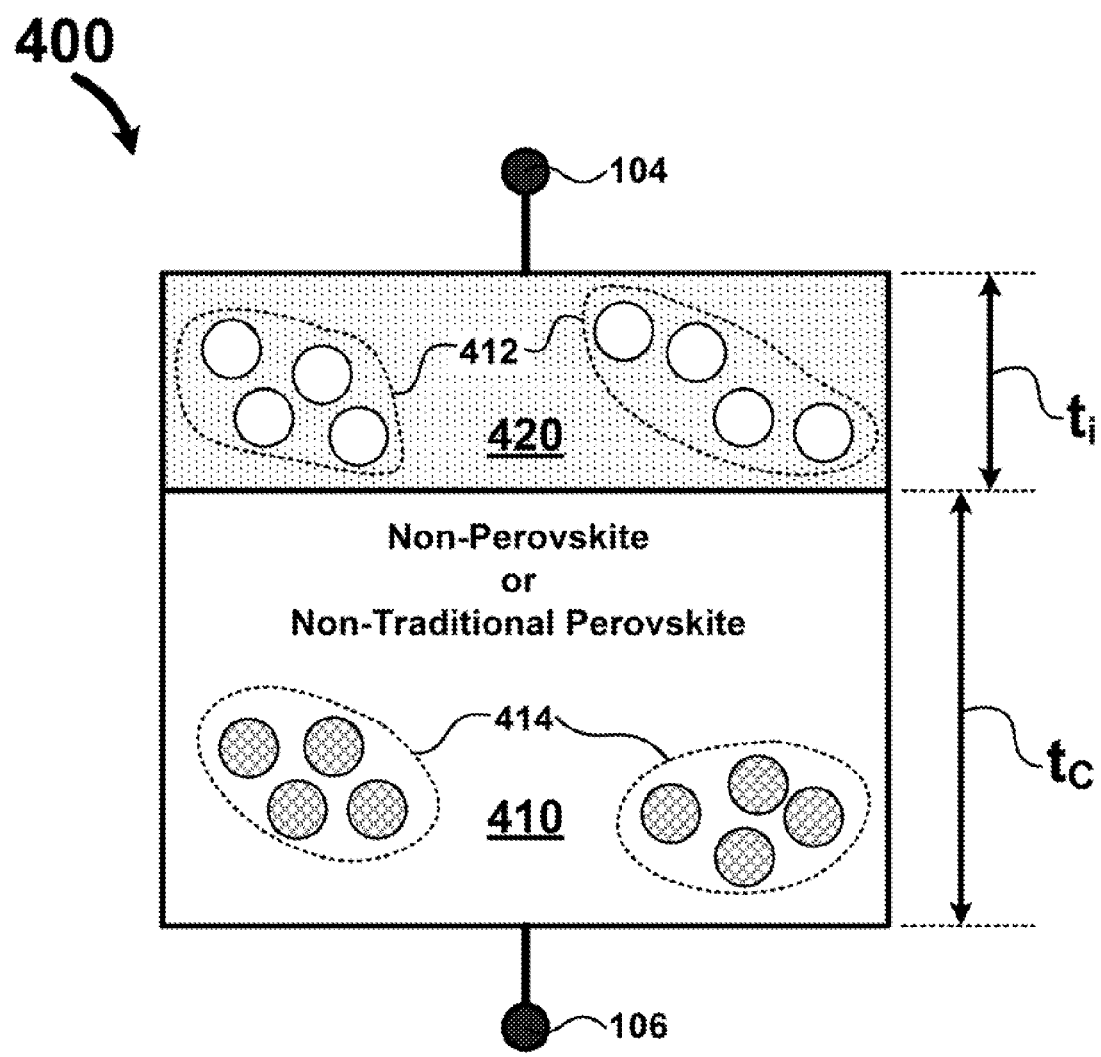
FIG. 4 depicts a memory cell implementing non-perovskite or non-traditional perovskite conductive metal oxides according to various embodiments of the invention.

FIG. 4 depicts a memory cell 400 implementing either a non-perovskite conductive metal oxide or a non-traditional perovskite conductive metal oxide as an example of the CMO 110, according to at least some embodiments of the invention. In this example, the memory cell 400 includes a CMO structure 410 (e.g., as a reservoir for mobile ions 414) in contact with and electrically in series with an electrolytic insulator 420. The electrolytic insulator 420 includes vacancies as was described above in reference to FIGS. 1-1D. The layers 410 and 420 are disposed between and are electrically in series with terminals 104 and 106, across which the aforementioned potential differences (e.g., V$_P$, V$_E$, and read voltages) can be applied. The CMO for the structure 410 can include a non-traditional multiple B-site perovskite or a Ruddlesden-Popper structure as will be described below in reference to FIGS. 5A and 5B. The thicknesses t$_C$ and t$_i$ will be application dependent. As one example, thickness t$_C$ for layer 410 can be from about 100 Å to about 350 Å and thickness t$_i$ for layer 420 can be from about 10 Å to about 35 Å.

Figure 5A:
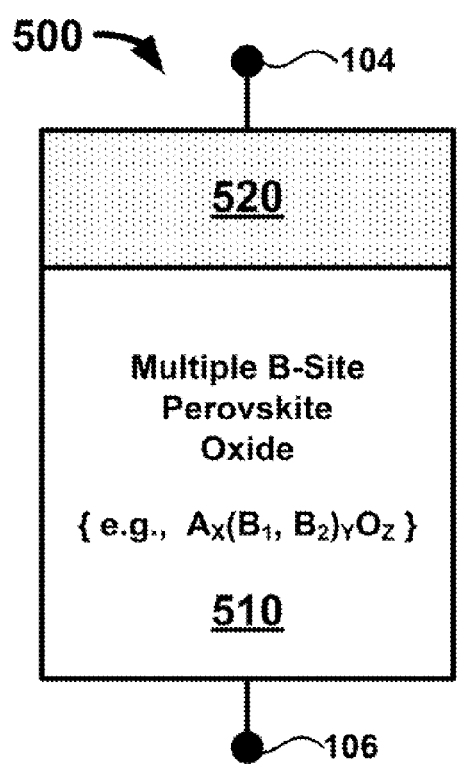
FIG. 5A depicts an example of a memory cell implementing a non-traditional multiple B-site perovskite conductive metal oxide according to various embodiments of the invention.
Figure 5B:
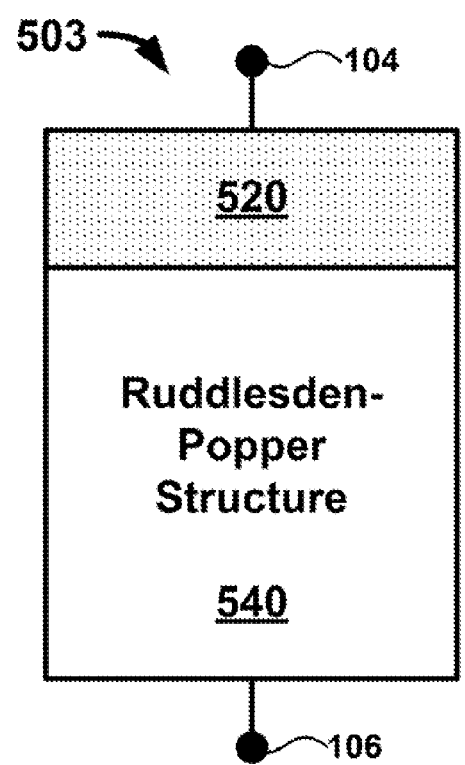
FIG. 5B depicts an example of a memory cell implementing a Ruddlesden-Popper conductive metal oxide according to various embodiments of the invention.

FIGS. 5A and 5B depict examples of memory cells implementing additional types of conductive metal oxides for the layer 410 of FIG. 4, according to various embodiments of the invention. In the example depicted in FIG. 5A, memory cell 500 includes an electrolytic insulator 520 and a multiple B-site Perovskite oxide material 510 as the structure 410 of FIG. 4. Specifically, multiple B-site Perovskite oxide material 510 can be formed to include two or more elements at the B sites in the unit cells of a perovskite structure. Multiple B-site Perovskite oxide material 510 can be represented as having the form A$_X$(B$_1$, B$_2$)$_Y$O$_Z$, where A represents a site at which one or more elements can be disposed, B$_1$ and B$_2$ represents at least two elements located at the B-sites of a perovskite structure, where the element for the B$_1$ site is different than the element for the B$_2$ site. For example, the multiple B-site perovskite material 510 includes the perovskite unit cell structure with each unit cell having a B-site. Some portion of the B-sites in the unit cells will have the B$_1$ element and another portion of the B-sites in the unit cells will have the B$_2$ element. The number of unit cells having the B$_1$ element at their respective B-sites may not be equal to the number of unit cells having the B$_2$ element at their respective B-sites. As another example, in the layer 510, one unit cell may have a B$_1$ element at its B-site and an adjacent unit cell may have a B$_2$ element at its B-site. Therefore, throughout the layer 510, some unit cells have the B$_1$ element at their B-sites and other unit cells have the B$_2$ element at their B-sites. In the multiple B-site Perovskite oxide material 510, O represents oxygen, where Z typically is 3, X can be any number, and Y typically is 1. In at least some embodiments, cobaltites and ferrites can be disposed at the B sites (i.e., the elements cobalt (Co) and iron (Fe)). An example of multiple B-site Perovskite oxide material 510 can be described as (LaSr(CoFe)O$_3$, where the La and Sr elements are disposed at the A-sites and the Co and Fe elements are disposed at the B-sites, B$_1$ and B$_2$ respectively. In various embodiments, B$_1$ and B$_2$ elements can include one or more elements from the transition metals, with the element for B$_1$ being different than the element for B$_2$.

FIG. 5B depicts a memory cell 503 implementing a Ruddlesden-Popper structure conductive metal oxide for the layer 410 of FIG. 4, according to various embodiments of the invention. In the example shown, the memory cell 503 includes an electrolytic insulator 520 and a Ruddlesden-Popper structure 540. In some embodiments, Ruddlesden-Popper structure 540 can be a perovskite of, for example, a type ABO$_3$. In some embodiments, Ruddlesden-Popper structure 540 can be formed as a Ruddlesden-Popper type oxide that can generally be described as having the form AO(ABO$_3$)$_n$, or any variants thereof, where n represents a Ruddlesden-Popper phase. In some cases, the A sites can include elements from the alkaline earth metals, and the B sites can include elements from the transition metal elements. As an oxide, Ruddlesden-Popper structure 540 can have an oxygen-deficient state and can be configured to promote ion conduction by, for example, using dopants that facilitate oxygen ion conduction.

One advantage of the non-perovskite and non-traditional perovskite CMO's described herein is that the materials for the CMO 110 are selected to meet at least two conductive properties that can be tailored to provide desired device performance criteria: (1) the material selected for the CMO 110 is electronically conductive to generate sufficient current created by electron and/or hole motion; and (2) the material selected for the CMO 110 is ionically conductive to provide sufficient ion current (e.g., via mobile ions 114) that is responsive to the first and second electric fields (E$_1$, E$_2$) that are generated by the voltages (e.g., V$_P$ and V$_E$) applied across the terminals (104, 106). Depending on factors including but not limited to the material selected for the CMO 110 (e.g., the CMO's depicted in FIGS. 2A-5B), the thicknesses t$_C$ and t$_i$, properties (1) and (2) can be balanced so that property (1) comprises the largest component of the current and property (2) comprises the smallest component of the current, or vice-versa. Accordingly, the CMO 110 comprises a mixed ionic electric conductor in that the current in memory cell 100 includes electron/hole current and ion current.

Figure 6:
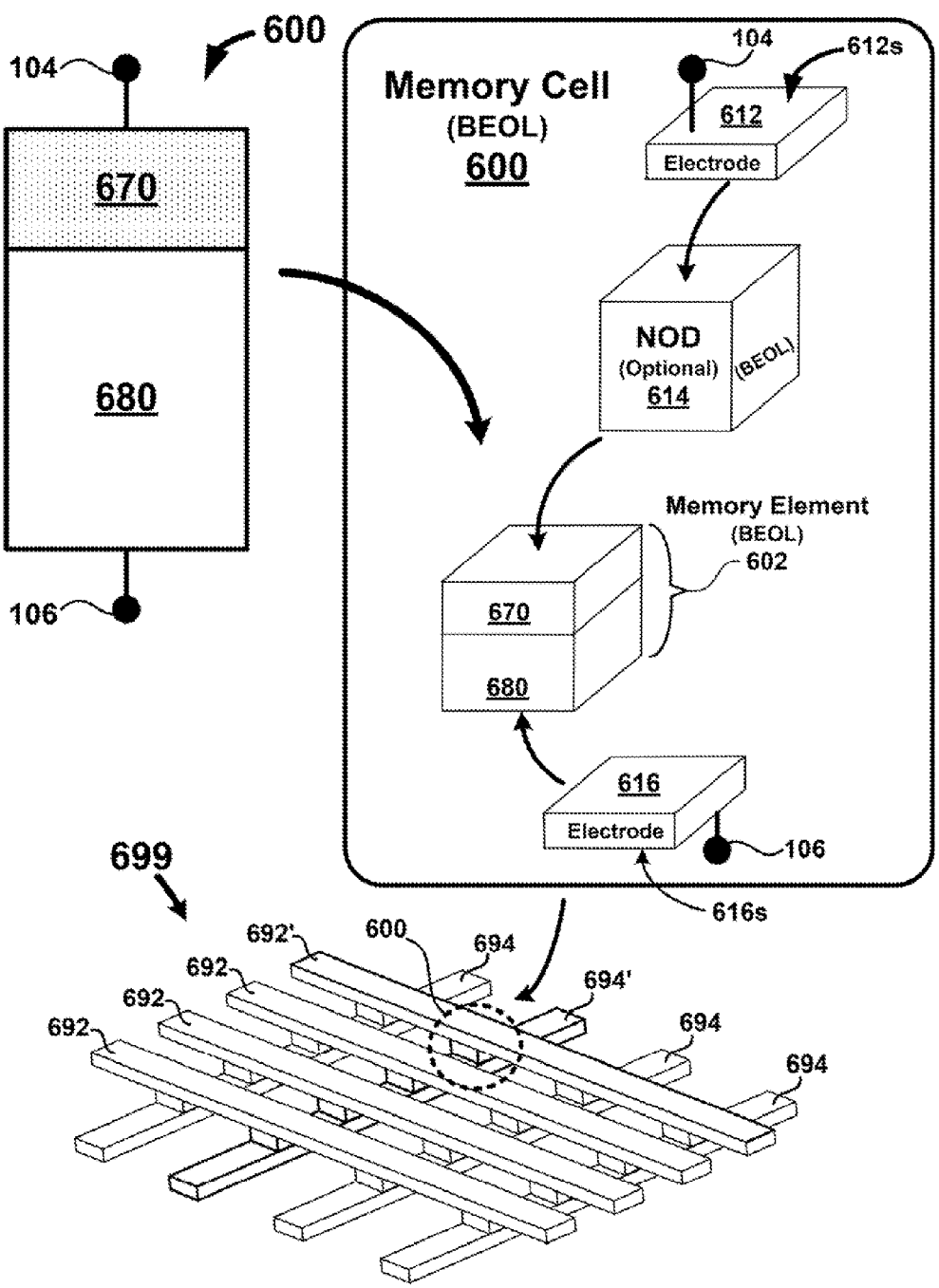
FIG. 6 depicts an example of memory cells positioned in a two-terminal cross-point array according to various embodiments of the invention.

FIG. 6 depicts an example of arrayed memory cells according to various embodiments of the invention. In this example, a memory cell 600 includes a memory element 602, which, in turn, includes an electrolytic insulator 670 and CMO material 680. Memory cell 600 further includes two terminals 104 and 106. Terminals 104 and 106 can be electrically coupled with or can be formed as electrodes 612 and 616. The electrodes (612, 616) can be made from an electrically conductive material including but not limited to, platinum (Pt), gold (Au), silver (Ag), iridium (Ir), iridium oxide (IrO$_X$), ruthenium (Ru), palladium (Pd), aluminum (Al), and the like.

In at least some embodiments, memory cell 600 can include a non-ohmic device (NOD) 614, which, in turn, can be formed on the memory element 602 (e.g., either above or below memory element 602). NOD 614 can be a "metal-insulator-metal" (MIM) structure that includes one or more layers of electronically insulating material that are in contact with one another and sandwiched between metal layers (e.g., electrodes), or NOD 614 can be a pair of diodes connected in a back-to-back configuration. U.S. Pat. No. 7,995,371, issued on Aug. 9, 2011, and titled "Threshold Device For A Memory Array" and U.S. Pat. No. 7,884,349, issued on Feb. 8, 2011, and titled "Selection Device for Re-Writable Memory" are both hereby incorporated by reference in their entirety and for all purposes and describe metal-insulator-metal and diode based non-ohmic devices. Memory cell 600 can be formed between conductive array lines, such as array lines 692' and 694'. Thus, memory cell 600 can be formed in an array of other memory cells, the array can be a cross-point array 699 including groups of conductive array lines 692 and 694. For example, array lines 692 can be electrically coupled with the electrodes 612 of the memory cells 600 and/or may be in contact with a surface 612s of the electrodes 612 and array lines 694 can be electrically coupled with the electrodes 616 of the memory cells 600 and/or may be in contact with a surface 616s of the electrodes 616.

Figure 6A:
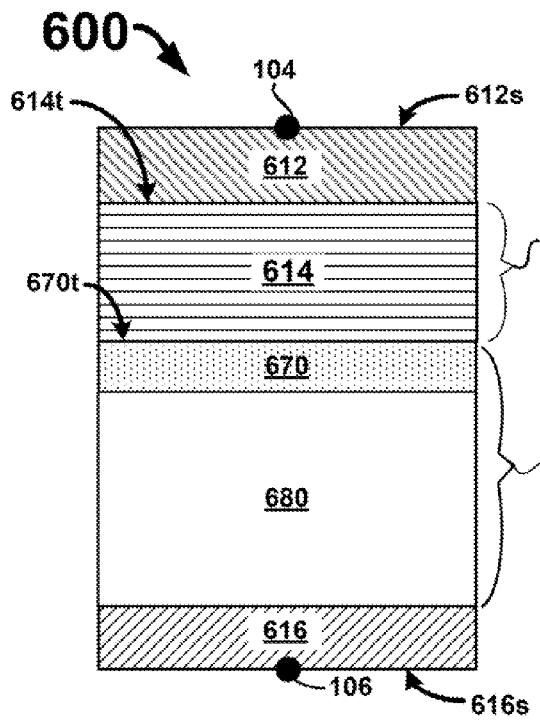
FIG. 6A depicts one example of a memory cell that includes a memory element electrically in series with a non-ohmic device.
Figure 6B:
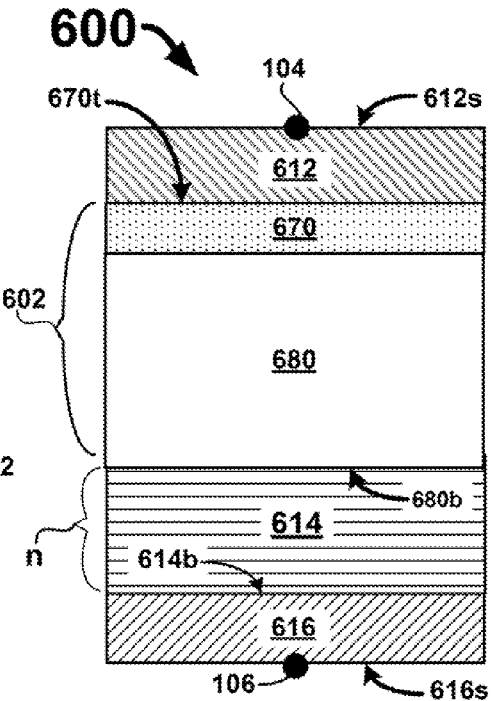
FIG. 6B depicts another example of a memory cell that includes a memory element electrically in series with a non-ohmic device.

Moving now to FIGS. 6A and 6B, memory cells 600 include the non-ohmic device 614. The non-ohmic device 614 is electrically in series with the memory element 602 and the pair of electrodes (612, 616). As was discussed above, each memory cell 600 stores data as a plurality of conductivity profiles. Therefore, each memory element 602 can be schematically depicted as a resistor that is electrically in series with the non-ohmic devices 614. A resistance at a certain voltage of a specific memory element 602 is indicative of a value of stored data in that memory element 602. As an example, each memory element 602 can store a single bit of data as one of two distinct conductivity profiles having a first resistive state $R_0$ at a read voltage $V_R$ indicative of a logic "0" and a second resistive state $R_1$ at $V_R$ indicative of a logic "1", where $R_0 \neq R_1$. Preferably, a change in conductivity, measured at the read voltage $V_R$, between $R_0$ and $R_1$ differs by a large enough factor so that a sense unit that is electrically coupled with the memory element 602 can distinguish the $R_0$ state from the $R_1$ state. For example, the factor can be at least a factor of approximately 5. Preferably, the predetermined factor is approximately 10 or more (e.g., $R_0 \approx 1$ MΩ and $R_1 \approx 100$ kΩ). The larger the predetermined factor is, the easier it is to distinguish between resistive states $R_0$ and $R_1$. Furthermore, large predetermined factors may also allow intermediate resistive states (e.g., $R_{00}$, $R_{01}$, $R_{10}$, and $R_{11}$).

The resistance of the memory element 602 may not be a linear function of the voltage applied across the memory element 602 at the electrodes (612, 616). Therefore, a resistance $R_S$ of the memory elements 602 can approximately be a function of the applied voltage V such that $R_S \approx f(V)$. The applied voltage V can be a read voltage, a write voltage, or a half-select voltage. Moreover, because the non-ohmic devices 614 are electrically in series with their respective memory element 602, a resulting series resistance creates a voltage drop across the non-ohmic devices 614 such that the actual voltage across the memory element 602 will be less than the voltage applied across the electrodes (612, 616). As one example, if the read voltage $V_R \approx 3V$ and the voltage drop across the non-ohmic devices 614 is approximately 2.0V, then an effective read voltage across the memory element 602 is approximately 1.0V.

The non-ohmic devices 614 create a non-linear I-V characteristic curve that falls within a desired operational current-voltage range for data operations (e.g., read and write operations) to the memory element 602. The non-ohmic devices 614 substantially reduce or eliminate current flow when the memory element 602 is not selected for a read or write operation. The non-ohmic devices 614 allow data to be written to the memory element 602 when a write voltage $V_W$ of appropriate magnitude and polarity is applied across the electrodes (612, 616) of a selected memory element 602. Similarly, the non-ohmic devices 614 allow data to be read from the memory element 602 when a read voltage $V_R$ of appropriate magnitude and polarity is applied across the electrodes (612, 616) of a selected memory element 602. An additional function of the non-ohmic devices 614 is to substantially reduce or eliminate current flow through half-selected and un-selected memory elements 602.

The non-ohmic devices 614 may include a plurality of layers of thin film materials that are in contact with one another and are denoted as n in FIGS. 6A and 6B. Those layers can include a pair of electrodes that sandwich one or more layers of a dielectric material. The dielectric material(s) are operative as a tunnel barrier layer(s) that generate the non-linear I-V characteristic of the non-ohmic devices 614. As one example, the non-ohmic devices 614 can comprise a sandwich of Pt electrode/$TiO_X$ dielectric layer/Pt electrode. The thicknesses of the Pt and $TiO_X$ materials will be application dependent. The Pt electrodes may have a thickness in a range from about 500 Å to about 100 Å, for example. The $TiO_X$ dielectric layer may have a thickness in a range from about 50 Å to about 10 Å, for example. Examples of suitable materials for the dielectric layers for the non-ohmic devices 614 include but are not limited to $SiO_2$, $Al_2O_3$, $SiN_X$, $HfSiO_X$, $ZrSiO_X$, $Y_2O_3$, $Gd_2O_3$, $LaAlO_3$, $HfO_2$, $ZrO_2$, $Ta_2O_5$, $TiO_X$, yttria-stabilized zirconia (YSZ), $Cr_2O_3$, and $BaZrO_3$. Suitable materials for the electrically conductive layers for the electrodes of the non-ohmic devices 614 include but are not limited to metals (e.g., aluminum Al, platinum Pt, palladium Pd, iridium Ir, gold Au, copper Cu, tantalum Ta, tantalum nitride TaN, titanium (Ti), and tungsten W), metal alloys, refractory metals and their alloys, and semiconductors (e.g., silicon Si). Alternatively, the non-ohmic devices 614 can include a pair of diodes connected in a back-to-back configuration (not shown), for example. Each of the diodes can be manufactured to only allow current to flow in a certain direction when its breakdown voltage (of a predetermined magnitude and polarity) is reached.

In FIG. 6A, the non-ohmic device 614 is positioned adjacent to electrode 612; whereas, in FIG. 6B, the non-ohmic device 614 is positioned adjacent to electrode 616. In some applications, the material for the pair of electrodes (612, 616) will be compatible with the electrode material for the non-ohmic devices 614. In those applications, one of the pair of electrodes (612, 616) can serve as one of the electrodes for the non-ohmic devices 614.

Figure 6C:
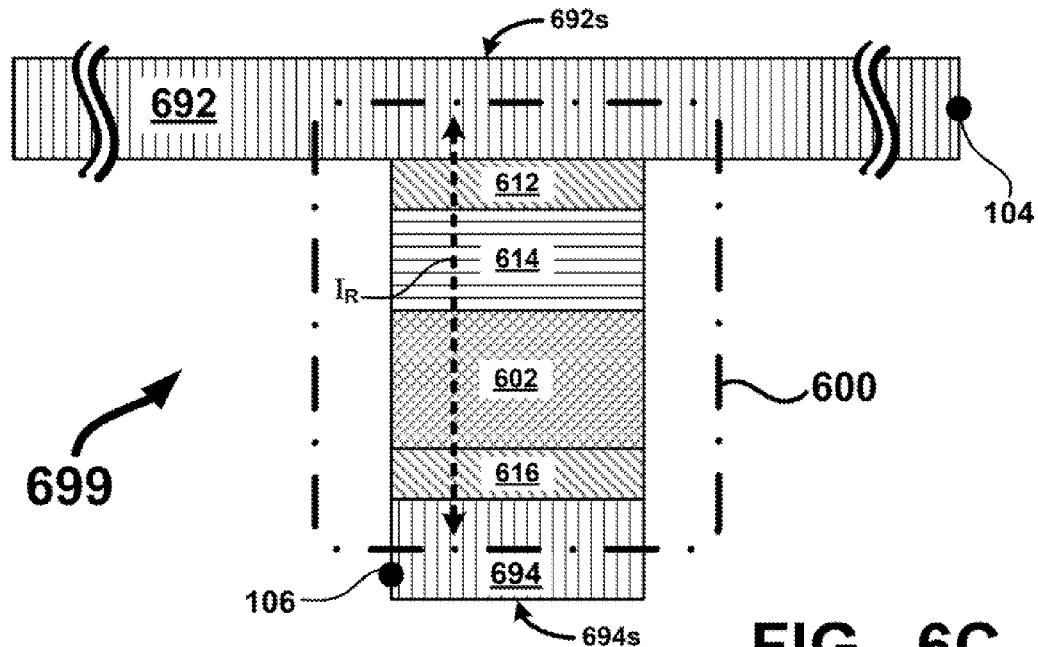
FIG. 6C depicts a memory cell positioned between a cross-point of two conductive array lines.

Reference is now made to FIG. 6C, where a portion of the cross-point array 699 includes a plurality of first conductive array lines 692 (one is depicted) and a plurality of second conductive array lines 694 (one is depicted), and a plurality memory cells 600 (one is depicted). Each memory cell 600 includes a first terminal 104 in electrical communication with only one of the first conductive array lines 692 and a second terminal 106 in electrical communication with only one of the second conductive array lines 694. Each memory cell 600 includes a memory element 602 that is electrically in series with the first and second terminals (104, 106). The first and second terminals (104, 106) can be the pair of electrodes (612, 616) described in reference to FIGS. 6, 6A, and 6B. As depicted in FIG. 6C, the memory cell 600 may include the above mentioned non-ohmic devices 614. The non-ohmic device 614 is electrically in series with the first and second terminals (104, 106) and with the memory element 602. The position of the non-ohmic device 614 in the memory cell 600 can be as depicted or the non-ohmic device 614 can be positioned between the second terminal 106 and the memory element 602. Although, non-ohmic device 614 is depicted, the memory cell 600 need not include a non-ohmic device 614 and the first terminal 104 may be in contact with the memory element 602.

Although a coordinate system is not depicted, the first conductive array lines 692 may be substantially aligned with an X-axis (e.g., running from left to right on the drawing sheet) and the second conductive array lines 694 may be substantially aligned with a Y-axis (e.g., looking into the drawing sheet). The aforementioned read and write and voltages are applied to a selected memory cell 600 by applying the voltages across the two conductive array lines that the memory cell 600 is positioned between. In FIG. 6C, by applying the read and write and voltages across the terminals (104, 106), stored data can be read from the selected memory cell 600 or new data can be written to the selected memory cell 600. A read current $I_R$ flows through the selected memory cell 600, the memory element 602, and the non-ohmic device 614, if it is included in the memory cell 600. The direction of flow of the read current $I_R$ (e.g., substantially along a Z-axis) will depend on the polarity of the read voltage. For example, if a positive read voltage potential is applied to terminal 104 and a negative read voltage potential is applied to the terminal 106, then the read current $I_R$ will flow from the first conductive array line 692 to the second conductive array line 694. In some applications, the memory cell 600 comprises the smallest repeatable unit that makes up the array 699 and may include all or a portion of the conductive array lines (692, 694) as denoted by the dashed line for the memory cell 600. One skilled in the art will appreciate that a dielectric material such as silicon oxide ($SiO_x$), silicon nitride ($SiN_x$), or the like may be used to electrically isolate adjacent memory cells 600 from one another and to fill in open areas within the array 699.

Figure 6D:
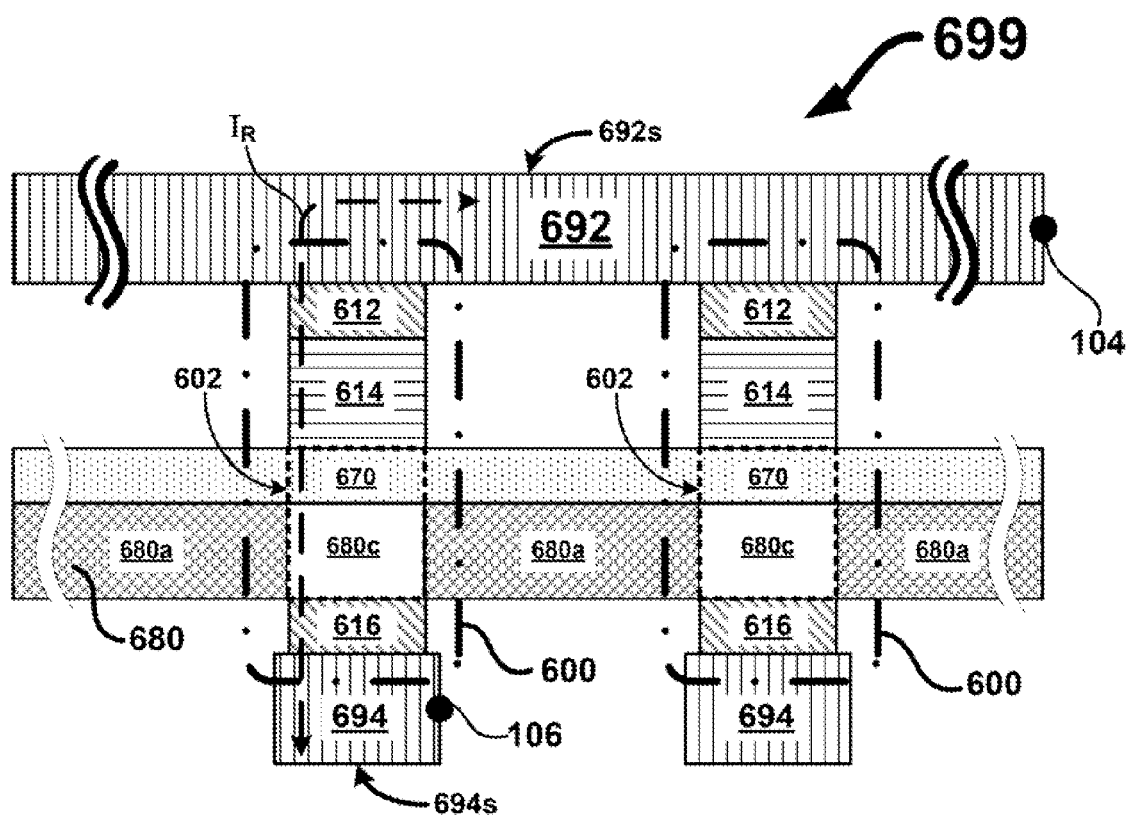
FIG. 6D depicts a plurality of memory cells including memory element with continuous and unetched layers and positioned between cross-points of conductive array lines.

Attention is now directed to FIG. 6D, where the array 699 includes a plurality of memory cells 600. However, unlike the memory cell 600 of FIG. 6C, where the memory element 602 comprises discrete (e.g., etched) layers for CMO 680 and electrolytic insulator 670 and those layers are substantially vertically aligned with other thin film layers (e.g., the electrodes) in the memory cell 600, the memory cells 600 of FIG. 6D comprise continuous and unetched layers of material for the CMO 680 and electrolytic insulator 670. In FIG. 6D, for each memory element 602 (shown in dashed outline), portions 680c of the CMO layer 680 that are positioned substantially within the dashed outline for the memory element 602 are crystalline in structure and are electrically conductive. In contrast, portions 680a that are positioned substantially outside the dashed outline are amorphous in structure and are electrically insulating and may be referred to as insulating metal oxide (IMO) regions 680a. The IMO regions 680a electrically isolate adjacent memory cells 600 and their respective memory elements 602 from one another. For example, when a read voltage is applied across terminals 104 and 106, the resulting read current $I_R$ flows through the memory cell 600 on the left and does not electrically interact with the memory cell 600 on the right due to the insulating properties of the IMO regions 680a. The IMO regions 680a can be formed by ion implantation of portions of the CMO layer 680 during fabrication. Layers of thin film materials positioned above layer 670 may be used as an implantation mask operative to protect masked portions of the CMO layer 680 from the implanted species. Portions of the CMO layer 680 that are not protected by the mask are implanted and become the IMO regions 680a. One skilled in the art will appreciate that a dielectric material such as silicon oxide ($SiO_x$), silicon nitride ($SiN_x$), or the like may be used to electrically isolate adjacent memory cells 600 from one another and to fill in open areas within the array 699.

Figure 7:
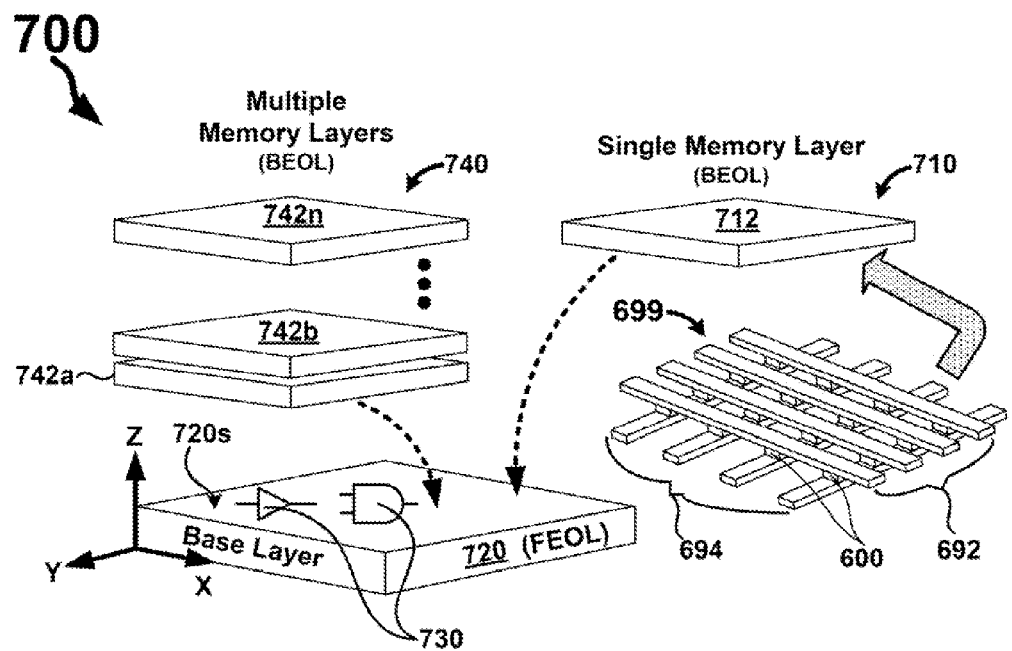
FIG. 7 depicts an integrated circuit including memory cells disposed in a single memory array layer or in multiple memory array layers and fabricated over a substrate that includes active circuitry fabricated in a logic layer.

Turning now to FIG. 7, an integrated circuit 700 can include non-volatile and re-writable memory cells 600 disposed in a single layer 710 or in multiple layers 740 of memory, according to various embodiments of the invention. In this example, integrated circuit 700 is shown to include either multiple layers 740 of memory (e.g., layers 742a, 742b, ... 742n) or a single layer 710 of memory 712 formed on (e.g., fabricated above) a base layer 720 (e.g., a silicon wafer). In at least some embodiments, each layer of memory (712, or 742a, 742b, ... 742n) can include the cross point array 699 having conductive array lines (692, 694) arranged in different directions (e.g., substantially orthogonal to one another) to access memory cells 600 (e.g., two-terminal memory cells). For example, conductors 692 can be X-direction array lines (e.g., row conductors) and conductors 694 can be Y-direction array lines (e.g., column conductors). Base layer 720 can include a bulk semiconductor substrate upon which circuitry, such as memory access circuits (e.g., address decoders, drivers, sense amps, etc.) can be formed. For example, base layer 720 may be a silicon (Si) substrate upon which the active circuitry 730 is fabricated. The active circuitry 730 includes analog and digital circuits configured to perform data operations on the memory layer(s) that are fabricated above the base layer 720. An interconnect structure (not shown) including vias, plugs, thrus, and the like, may be used to electrically communicate signals from the active circuitry 730 to the conductive array lines (692, 694).

Figure 8A:
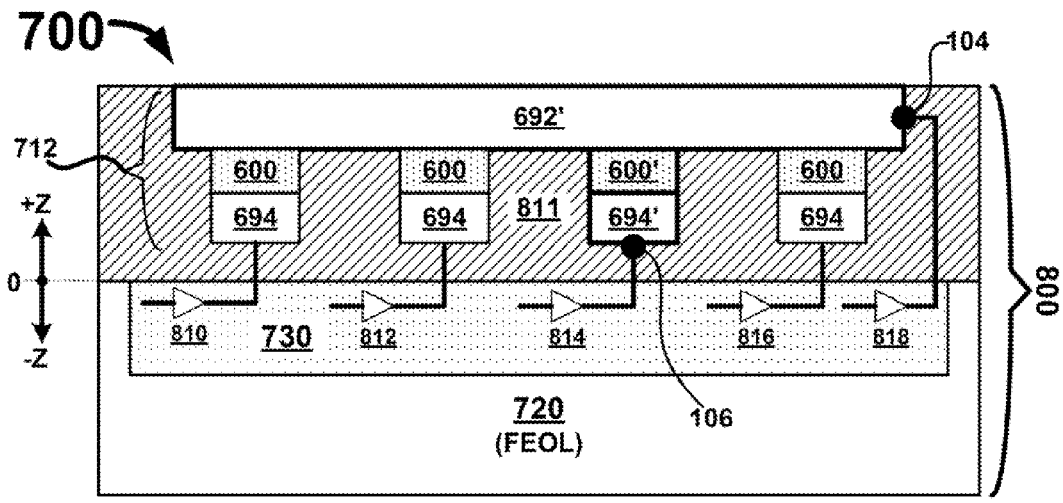
FIG. 8A depicts a cross-sectional view of an integrated circuit including a single layer of memory fabricated over a substrate including active circuitry fabricated in a logic layer.

Reference is now made to FIG. 8A, where integrated circuit 700 includes the base layer 720 and active circuitry 730 fabricated on the base layer 720. As one example, the base layer 720 can be a silicon (Si) wafer and the active circuitry 730 can be microelectronic devices formed on the base layer 720 using a CMOS fabrication process. The memory cells 600 and their respective conductive array lines (692, 694) can be fabricated on top of the active circuitry 730 in the base layer 720. Those skilled in the art will appreciate that an inter-level interconnect structure (not shown) can electrically couple the conductive array lines (692, 694) with the active circuitry 730 which may include several metal layers. For example, vias can be used to electrically couple the conductive array lines (692, 694) with the active circuitry 730. The active circuitry 730 may include but is not limited to address decoders, sense amps, memory controllers, data buffers, direct memory access (DMA) circuits, voltage sources for generating the read and write voltages, just to name a few. Active circuits 810-818 can be configured to apply the select voltage potentials (e.g., read and write voltage potentials) to selected conductive array lines (692', 694'). Moreover, the active circuitry 730 may be coupled with the conductive array lines (692', 694') to sense the read current $I_R$ from selected memory cells 600' during a read operation and the sensed current can be processed by the active circuitry 730 to determine the conductivity profiles (e.g., the resistive state) of the selected memory cells 600'. In some applications, it may be desirable to prevent un-selected array lines (692, 694) from floating. The active circuits 730 can be configured to apply an un-select voltage potential (e.g., approximately a ground potential) to the un-selected array lines (692, 694). A dielectric material 811 (e.g., $SiO_2$) may be used where necessary to provide electrical insulation between elements of the integrated circuit 700.

Figure 8B:
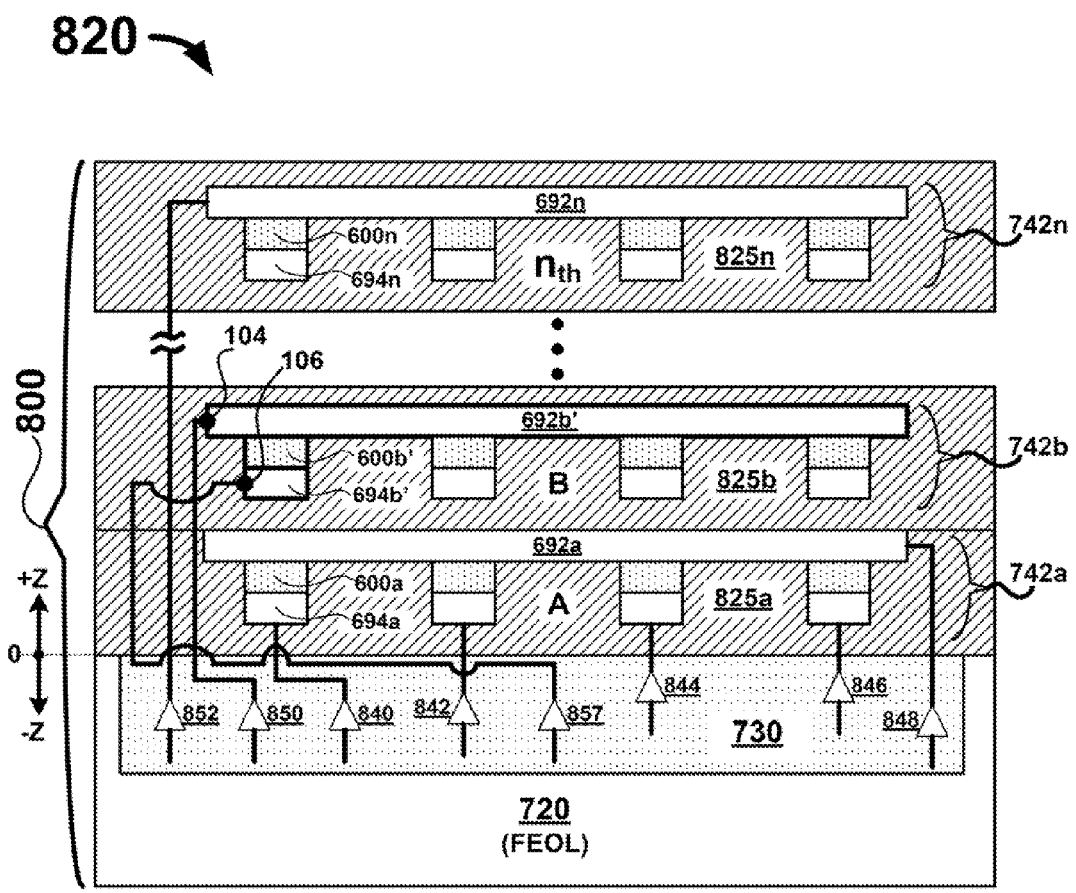
FIG. 8B depicts a cross-sectional view of an integrated circuit including vertically stacked layers of memory fabricated over a substrate including active circuitry fabricated in a logic layer.

Moving now to FIG. 8B, an integrated circuit 820 includes a plurality of non-volatile memory arrays that are vertically stacked above one another (e.g., along the Z-axis) and are positioned above the base layer 720 that includes the active circuitry 730. The integrated circuit 820 includes vertically stacked memory layers A and B and may include additional memory layers up to an nth memory layer. The memory layers A, B, . . . through the nth layer can be electrically coupled with the active circuitry 730 in the base layer 720 by an inter-level interconnect structure as was described above. Layer A includes memory cells 600*a* and first and second conductive array lines (692*a*, 694*a*), Layer B includes memory cells 600*b* and first and second conductive array lines (692*b*, 694*b*), and if the nth layer is implemented, then the nth layer includes memory cells 600*n* and first and second conductive array lines (692*n*, 694*n*). Dielectric materials 825*a*, 825*b*, and 825*n* (e.g., $SiO_2$) may be used where necessary to provide electrical insulation between the memory layers of the integrated circuit 820. Active circuits 840-857 can be configured to apply the select voltage potentials (e.g., read and write voltage potentials) to selected conductive array lines (e.g., 692*a, b,* . . . n, and 694*a, b,* . . . n). Driver circuits 850 and 857 are activated to select conductive array lines 692' and 694' to select memory cell 600*b'* for a data operation. As was described above, the active circuits 730 can be used to sense the read current $I_R$ from selected memory cells 600*b'* during a read operation and can be configured to apply the un-select voltage potential to the un-selected array lines.

Figure 8C:
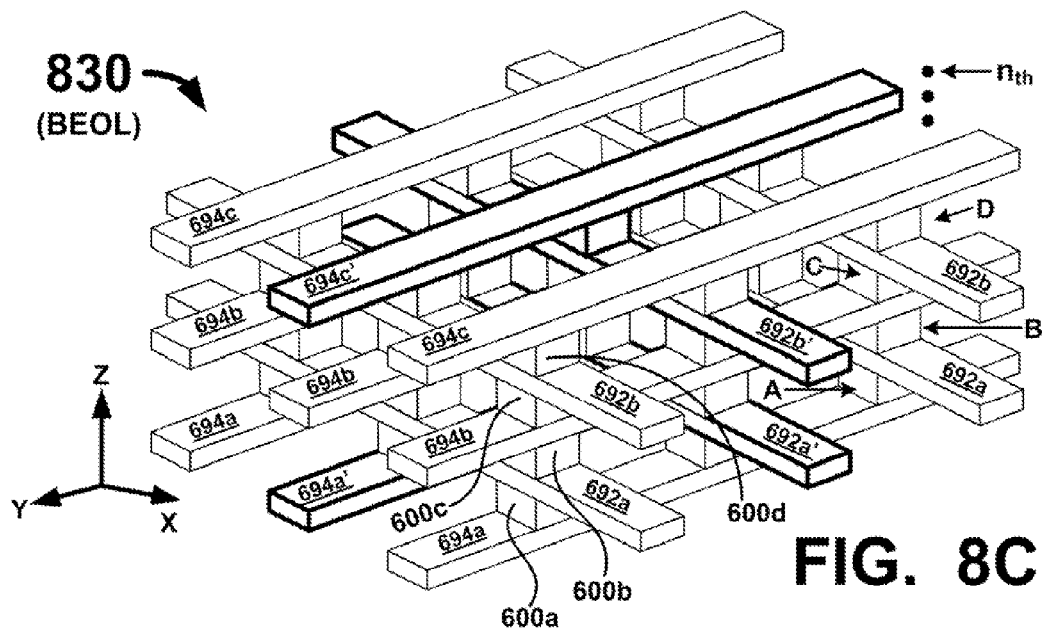
FIG. 8C depicts a vertically stacked layers of memory in which conductive array lines are shared by memory cells in adjacent layers.

Attention is now directed to FIG. 8C, where a vertically stacked array 830 includes a plurality of memory layers A, B, C, and D with each memory layer including memory cells 600*a*, 600*b*, 600*c*, and 600*d*. Although only four layers are depicted, the array 830 can include additional layers up to an nth layer. The array 830 includes two levels of x-direction conductive array lines 692*a* and 692*b*, and three levels of y-direction conductive array lines 694*a*, 694*b*, and 694*c*. In contrast to the integrated circuit 820 depicted in FIG. 8B where each array layer is electrically isolated from other layers by a dielectric material, each memory cell 600*a*, 600*b*, 600*c*, and 600*d* shares a conductive array line with other memory cells that are positioned above, below, or both above and below that memory cell. Conductive array lines 692*a'* and 694*a'* select a memory cell 600*a'* for a data operation, and conductive array lines 692*b'* and 694*c'* select a memory cell 600*d'* for a data operation (see FIG. 8D).

Figure 8D:
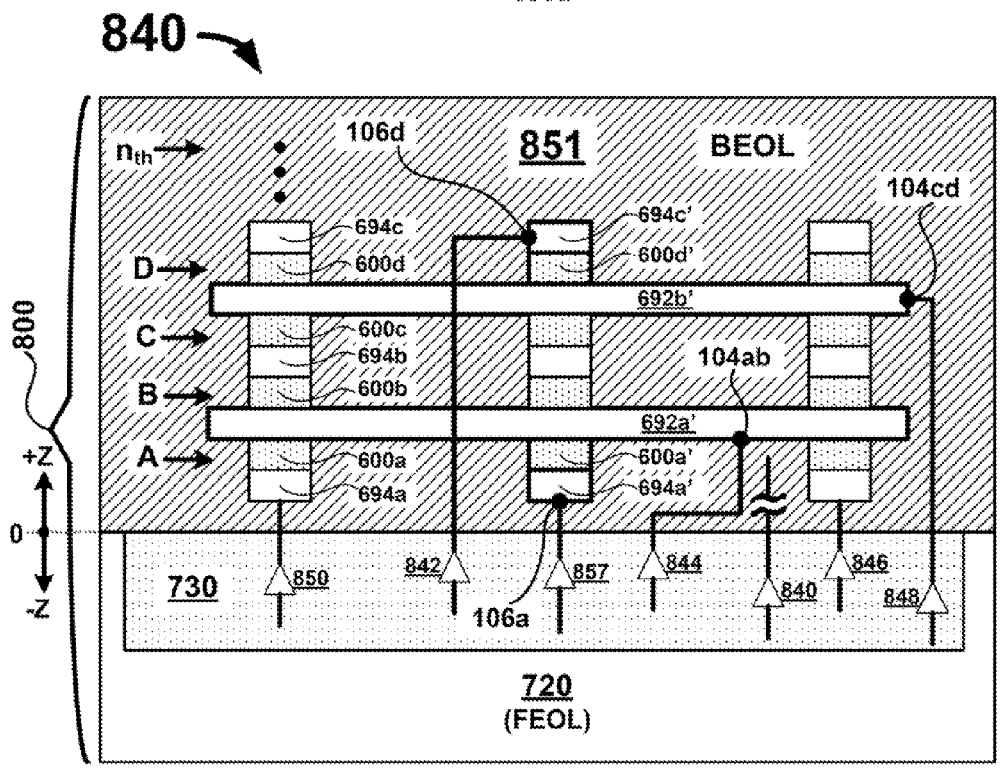
FIG. 8D depicts an integrated circuit including vertically stacked layers of memory with shared conductive array lines fabricated over a substrate including active circuitry fabricated in a logic layer.

In FIG. 8D, an integrated circuit 840 includes base layer 720, active circuitry 730, and vertically staked memory layers A, B, C, and D that are fabricated above the base layer 720. Active circuits 840-857 are configured to perform data operations on the vertically staked memory layers A, B, C, and D. Driver circuits 844 and 857 are activated to select memory cell 600*a'* for a data operation and driver circuits 842 and 848 are activated to select memory cell 600*d'* for a data operation. A dielectric layer 851 is operative to electrically isolate the various components of integrated circuit 840.

Figure 9:
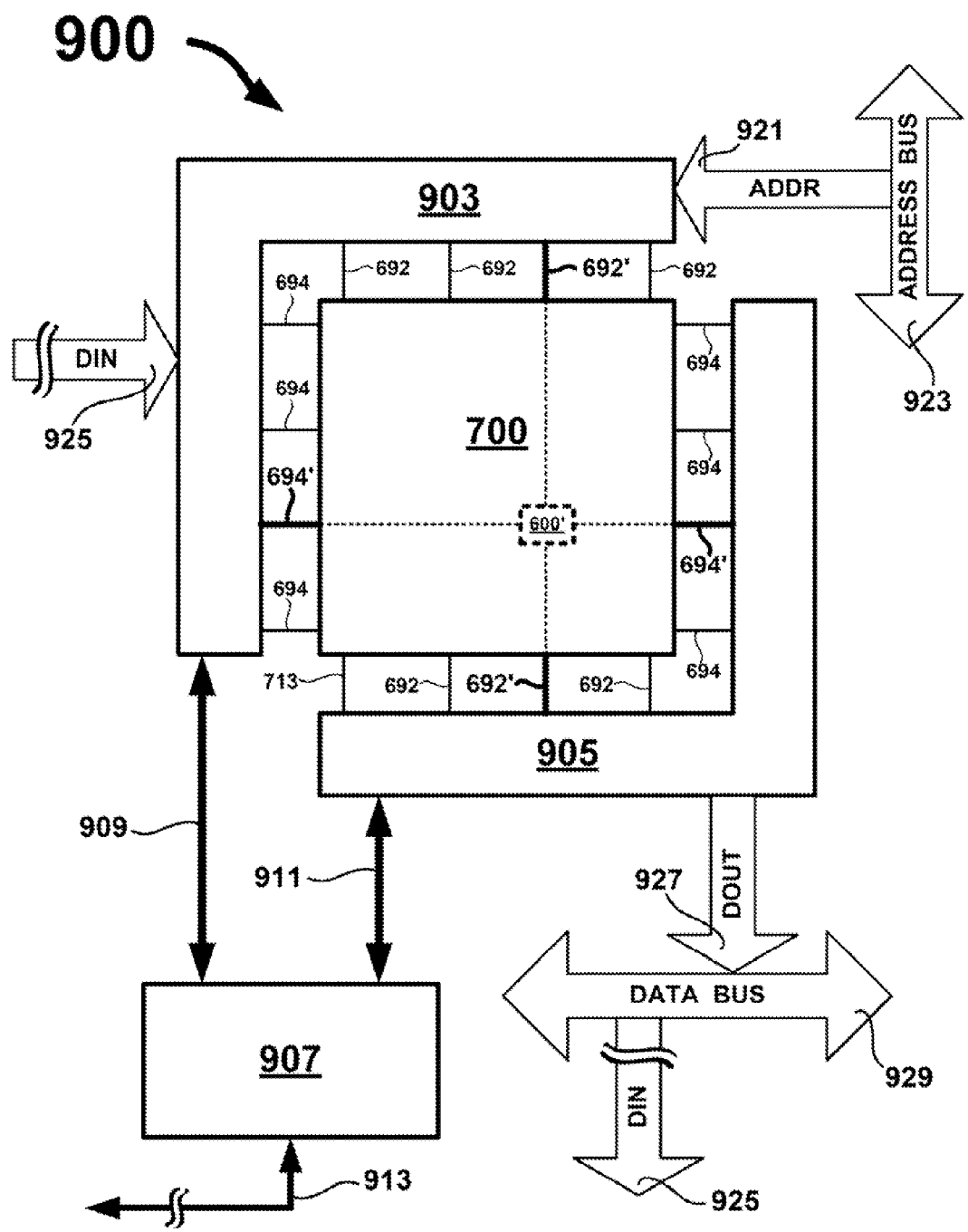
FIG. 9 depicts a memory system including a non-volatile two-terminal cross-point array.

Moving on to FIG. 9, an exemplary memory system 900 includes the aforementioned non-volatile two-terminal cross-point memory array 700 (array 700 hereinafter) and the plurality of first conductive and second conductive traces denoted as 692 and 694, respectively. The memory system 900 also includes an address unit 903 and a sense unit 905. The address unit 903 receives an address ADDR, decodes the address, and based on the address, selects at least one of the plurality of first conductive traces (denoted as 692') and one of the plurality of second conductive traces (denoted as 694'). The address unit 903 applies select voltage potentials (e.g., read or write voltages) to the selected first and second conductive traces 692' and 694'. The address unit 903 also applies a non-select voltage potential to unselected traces 692 and 694. The sense unit 905 senses one or more currents flowing through one or more of the conductive traces. During a read operation to the array 700, current sensed by the sense unit 905 is indicative of stored data in a memory cell 600' positioned at an intersection of the selected first and second conductive traces 692' and 694'. A bus 921 coupled with an address bus 923 can be used to communicate the address ADDR to the address unit 903. The sense unit 905 processes the one or more currents and at least one additional signal to generate a data signal DOUT that is indicative of the stored data in the memory plug. In some embodiments, the sense unit 905 may sense current flowing through a plurality of memory plugs and processes those currents along with additional signals to generate a data signal DOUT for each of the plurality of memory plugs. A bus 927 communicates the data signal DOUT to a data bus 929. During a write operation to the array 700, the address unit 903 receives write data DIN to be written to a memory plug specified by the address ADDR. A bus 925 communicates the write data DIN from the data bus 929 to the address unit 903. The address unit 903 determines a magnitude and polarity of the select voltage potentials to be applied to the selected first and second conductive traces 692' and 694' based on the value of the write data DIN. For example, one magnitude and polarity can be used to write a logic "0" and a second magnitude and polarity can be used to write a logic "1". In other embodiments, the memory system 900 can include dedicated circuitry that is separate from the address unit 903 to generate the select potentials and to determine the magnitude and polarity of the select potentials.

One skilled in the art will appreciate that the memory system 900 and its components (e.g., 903 and 905) can be electrically coupled with and controlled by an external system or device (e.g., a microprocessor or a memory controller). Optionally, the memory system 900 can include at least one control unit 907 operative to coordinate and control operation of the address and sense units 903 and 905 and any other circuitry necessary for data operations (e.g., read and write operations) to the array 700. One or more signal lines 909 and 911 can electrically couple the control unit 907 with the address and sense units 903 and 905. The control unit 907 can be electrically coupled with an external system (e.g., a microprocessor or a memory controller) through one or more signal lines 913.

As was described above in reference to FIGS. 7 through 8D, one or more of the arrays 700 can be positioned (e.g., fabricated BEOL) over a substrate 720 that includes active circuitry 730 and the active circuitry 730 can be electrically coupled with the array(s) 700 using an interconnect structure that couples signals from the active circuitry 730 with the conductive array lines 692 and 694. In FIG. 9, the busses, signal lines, control signals, the address, sense, and control units 903, 905, and 907 can comprise the active circuitry 730 and its related interconnect, and can be fabricated FEOL on the substrate 720 (e.g., a silicon wafer) using a microelectronics fabrication technology, such as CMOS, for example.

Figure 10:
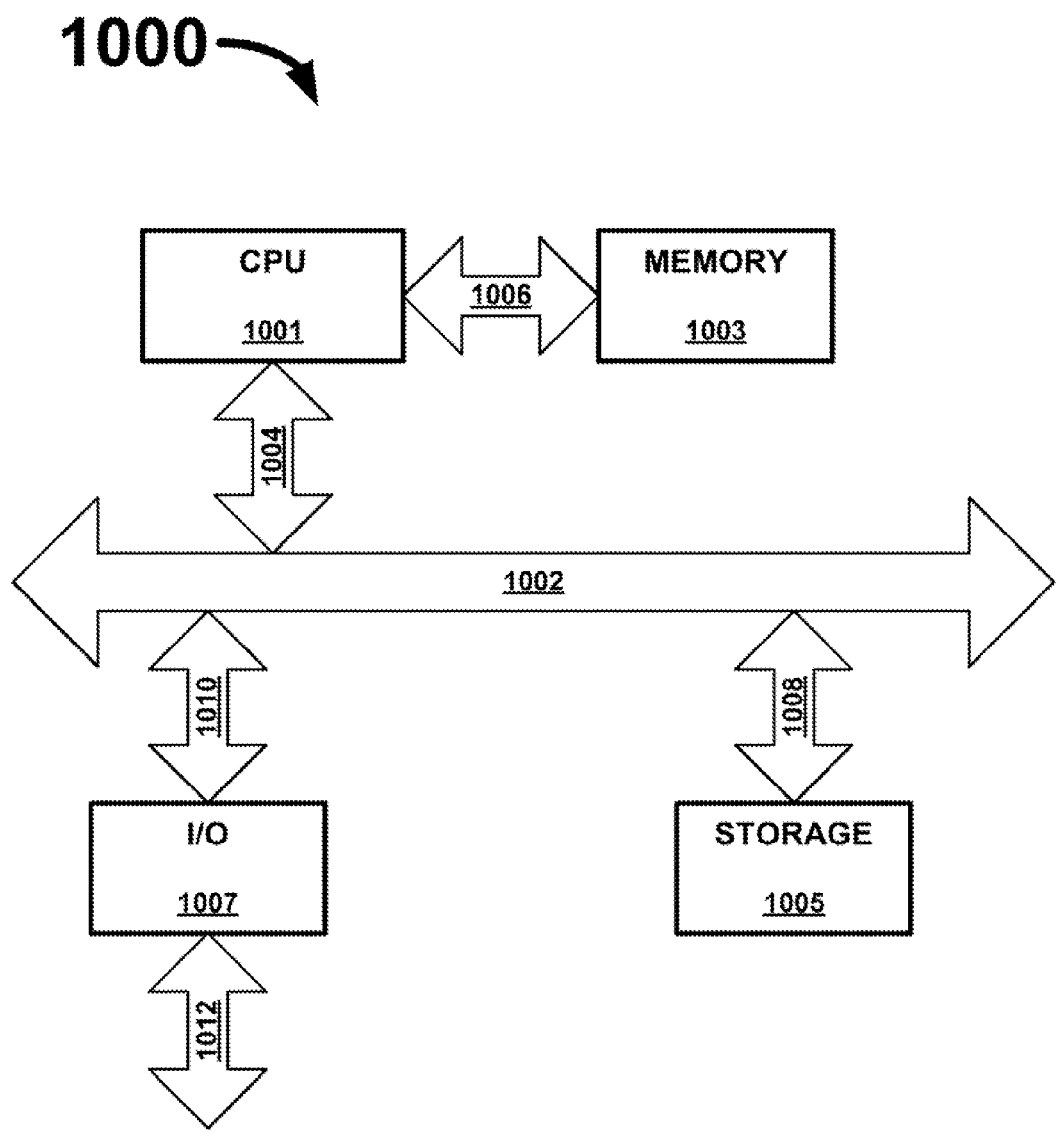
FIG. 10 depicts an exemplary electrical system that includes at least one non-volatile two-terminal cross-point array.

Reference is now made to FIG. 10, where an electrical system 1000 includes a CPU 1001 that is electrically coupled 1004 with a bus 1002, an I/O unit 1007 that is electrically coupled 1010 with the bus 1002, and a storage unit 1005 that is electrically coupled 1008 with the bus 1002. The I/O unit 1007 is electrically coupled 1012 to external sources (not shown) of input data and output data. The CPU 1001 can be any type of processing unit including but not limited to a microprocessor (µP), a micro-controller (µC), and a digital signal processor (DSP), for example. Via the bus 1002, the CPU 1001, and optionally the I/O unit 1007, performs data operations (e.g., reading and writing data) on the storage unit 1005. The storage unit 1005 stores at least a portion of the data in the aforementioned non-volatile two-terminal cross-point array as depicted in FIGS. 7 through 8D. Each memory array includes a plurality of the two-terminal memory cells 600.

The configuration of the storage unit 1005 will be application specific. Example configurations include but are not limited to one or more single layer non-volatile two-terminal cross-point arrays (e.g., 712) and one or more vertically stacked non-volatile two-terminal cross-point arrays (e.g., 742a-742n). In the electrical system 1000, data stored in the storage unit 1005 is retained in the absence of electrical power. The CPU 1001 may include a memory controller (not shown) for controlling data operations to the storage unit 1005.

Alternatively, the electrical system 1000 may include the CPU 1001 and the I/O unit 1007 coupled with the bus 1002, and a memory unit 1003 that is directly coupled 1006 with the CPU 1001. The memory unit 1003 is configured to serve some or all of the memory needs of the CPU 1001. The CPU 1001, and optionally the I/O unit 1007, executes data operations (e.g., reading and writing data) to the non-volatile memory unit 1003. The memory unit 1003 stores at least a portion of the data in the aforementioned non-volatile two-terminal cross-point array as depicted in FIGS. 7A through 8D. Each memory array includes a plurality of the two-terminal memory elements 120. The configuration of the memory unit 1003 will be application specific. Example configurations include but are not limited to one or more single layer non-volatile two-terminal cross-point arrays (e.g., 712) and one or more vertically stacked non-volatile two-terminal cross-point arrays (e.g., 742a-742n). In the electrical system 1000, data stored in the memory unit 1003 is retained in the absence of electrical power. Data and program instructions for use by the CPU 1001 may be stored in the memory unit 1003. The CPU 1001 may include a memory controller (not shown) for controlling data operations to the non-volatile memory unit 1003. The memory controller may be configured for direct memory access (DMA).

Figure 11:
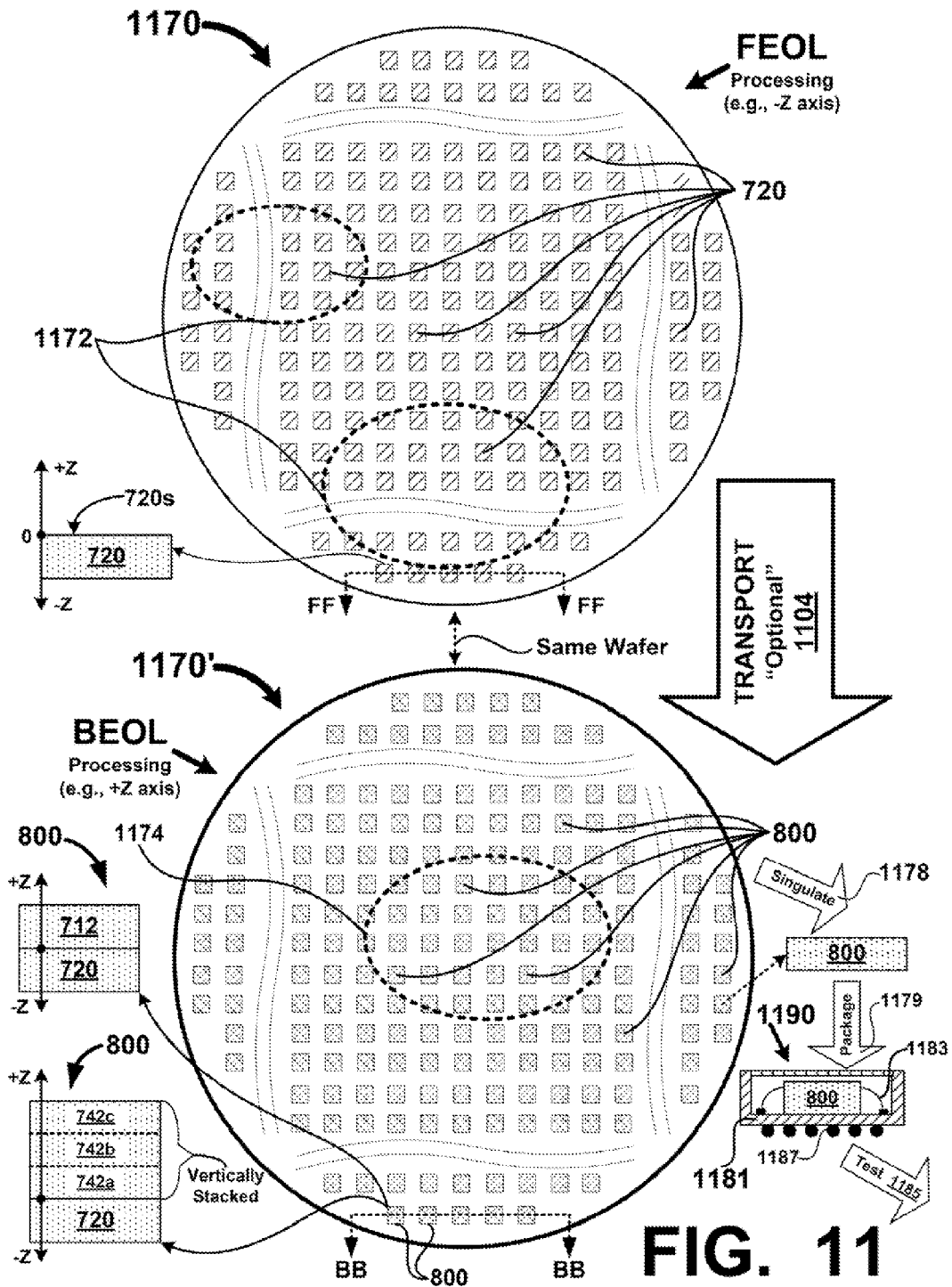
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Reference is now made to FIG. 11, where a top plan view depicts a single wafer (denoted as 1170 and 1170') at two different stages of fabrication: FEOL processing on the wafer denoted as 1170 during the FEOL stage of processing where active circuitry 730 is formed; followed by BEOL processing on the same wafer denoted as 1170' during the BEOL stage of processing where one or more layers of non-volatile memory are formed. Wafer 1170 includes a plurality of the base layer die 720 (see 720 in FIG. 7) formed individually on wafer 1170 as part of the FEOL process. As part of the FEOL processing, the base layer die 720 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 712 or multiple layers 742a, 742b, . . . 742n) directly on top of each base layer die 720. A base layer die 720 is depicted in cross-sectional view along a dashed line FF-FF where the substrate the die 720 is fabricated on (e.g., a silicon Si wafer) and its associated active circuitry 730 are positioned along the –Z axis. For example, the one or more layers of memory are grown directly on top of an upper surface 720s of each base layer die 720 as part of the subsequent BEOL processing.

During BEOL processing the wafer 1170 is denoted as wafer 1170', which is the same wafer subjected to additional processing to fabricate the memory layer(s) directly on top of the base layer die 720. Base layer die 720 that failed testing may be identified either visually (e.g., by marking) or electronically (e.g., in a file, database, email, etc.) and communicated to the BEOL fabricator and/or fabrication facility. Similarly, performance graded base layer die 720 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 720 to form a finished die 800 (see die 800 in FIGS. 8A, 8B, and 8D) that includes the FEOL circuitry portion 720 along the –Z axis and the BEOL memory portion along the +Z axis (see FIGS. 8A-8D). A cross-sectional view along a dashed line BB-BB depicts a memory device die 800 with a single layer of memory 712 grown (e.g., fabricated) directly on top of base die 720 along the +Z axis, and alternatively, another memory device die 800 with three vertically stacked layers of memory 742a, 742b, and 742c grown (e.g., fabricated) directly on top of base die 720 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield. One or more of the IC's 1190 can be used in a data storage system such as an embedded memory system (e.g., portable PC's, cell phones, PDA's, image capture devices, portable game players, MP3 players, video players, etc.), a RAID storage system in which the non-volatile memory in the one or more layers of memory in each IC 1190 is used to replace or supplant hard disc drives (HDD's) in the RAID system. Unlike conventional FLASH non-volatile memory, the IC's 1190 do not require an erase operation prior to a write operation so the latency associated with the erase operation is eliminated and the latency associated with FLASH OS and/or FLASH file system required for managing the erase operation is eliminated. Another application for the IC's 1190 is as a replacement for conventional FLASH-based non-volatile memory in solid state drives (SSD's). Here, one or more of the IC's 1190 can be mounted to a PC board along with other circuitry and placed in an appropriate enclosure to implement a SSD that can be used to replace a HDD. As mentioned above, the IC's 1190 do not require the erase before write operation and it associated latency and overhead. For both RAID and SSD applications, the vertically stacked memory arrays allow for increases in storage density without increasing die size The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A memory device, comprising:
a first terminal structure;
a second terminal structure; and
a re-writeable non-volatile two-terminal memory element electrically in series with the first and second terminal structures and operative to store at least one-bit of data as a plurality of conductivity profiles that are retained in the absence of electrical power, the memory element including
an electrically insulating high-k dielectric material in contact with the first terminal structure and including a first thickness configured for electron tunneling when a voltage for data operations is applied across the first and second terminal structures, and
a conductive binary oxide material including mobile oxygen ions and having a form $A_XO_Y$, where O represents oxygen and A represents a metal, the conductive binary oxide material is in contact with the electrically insulating high-k dielectric material and with the second terminal structure, wherein the electrically insulating high-k dielectric material includes vacancies operative to reversibly receive a portion of the mobile oxygen ions in response to a write voltage applied across the first and second terminal structures.

2. A memory device comprising:
a first terminal structure;
a second terminal structure; and
a re-writeable non-volatile two-terminal memory element electrically in series with the first and second terminal structures and operative to store at least one-bit of data as a plurality of conductivity profiles that are retained in the absence of electrical power, the memory element including
an electrically insulating high-k dielectric material in contact with the first terminal structure and including a first thickness configured for electron tunneling when a voltage for data operations is applied across the first and second terminal structures, and
a conductive binary oxide material including mobile oxygen ions and having a form $A_XO_Y$, where O represents oxygen and A represents a metal, the conductive binary oxide material is in contact with the electrically insulating high-k dielectric material and with the second terminal structure, and where the conductive binary oxide material comprises at least one of tin oxide, zinc oxide, or a doped titanium oxide.

3. The memory device of claim 2, wherein the titanium oxide is doped with niobium.

4. The memory device of claim 1, wherein the electrically insulating high-k dielectric material is an electrolyte to the mobile oxygen ions and is permeable to the mobile oxygen ions when the write voltage is applied.

5. The memory device of claim 1, wherein the first thickness is approximately 35 Å or less.

6. The memory device of claim 1, wherein the electrically insulating high-k dielectric material comprises a material selected from the group consisting of a rare earth oxide, a rare earth metal oxide, yttria stabilized zirconia (YSZ), zirconium oxide, yttrium oxide, hafnium oxide, gadolinium oxide, and erbium oxide.

7. The memory device of claim 1, wherein the conductive binary oxide material includes a structure selected from the group consisting of an amorphous structure, a single crystalline structure, a polycrystalline structure, a multi-phase crystalline structure, a mixed-phase crystalline structure, a columnar crystalline structure, and a micro-crystalline structure.

8. The memory device of claim 1 and further comprising:
a non-ohmic device electrically in series with the memory element and with the first and second terminal structures.

9. The memory device of claim 1, wherein the first terminal structure is electrically coupled with only one of a plurality of first conductive array lines in a two-terminal cross-point memory array and the second terminal structure is electrically coupled with only one of a plurality of second conductive array lines in the two-terminal cross-point memory array.

10. The memory device of claim 9, wherein the two-terminal cross-point memory array is connected with and is positioned above a substrate including active circuitry electrically coupled with the plurality of first and second conductive array lines and operative to perform data operation on the two-terminal cross-point memory array.

11. A memory device, comprising:
a first terminal structure;
a second terminal structure; and
a re-writeable non-volatile two-terminal memory element electrically in series with the first and second terminal structures and operative to store at least one-bit of data as a plurality of conductivity profiles that are retained in the absence of electrical power, the memory element including
an electrically insulating high-k dielectric material in contact with the first terminal structure and including a first thickness configured for electron tunneling when a voltage for data operations is applied across the first and second terminal structures, and
a conductive metal oxide (CMO) including mobile oxygen ions and made from a Ruddlesden-Popper material, the CMO is in contact with the electrolytic insulator and with the second terminal structure.

12. The memory device of claim 11, wherein the material having the Ruddlesden-Popper structure includes a form $ABO_3$, where O represents oxygen, A represents an alkaline earth metal element, and B represents a transition metal element.

13. The memory device of claim 11, wherein the material having the Ruddlesden-Popper structure includes a form $AO(ABO_3)n$, where O represents oxygen, A represents at least one alkaline earth metal element, B represents at least one transition metal element, and n represents a Ruddlesden-Popper phase.

14. The memory device of claim 11, wherein the first thickness is approximately 35 Å or less.

15. The memory device of claim 11, wherein the electrically insulating high-k dielectric material comprises a material selected from the group consisting of a rare earth oxide, a rare earth metal oxide, yttria stabilized zirconia (YSZ), zirconium oxide, yttrium oxide, hafnium oxide, gadolinium oxide, and erbium oxide.

16. The memory device of claim 11 and further comprising: a non-ohmic device electrically in series with the memory element and with the first and second terminal structures.

17. The memory device of claim 11, wherein the material having the Ruddlesden-Popper structure includes a structure selected from the group consisting of an amorphous structure, a single crystalline structure, a polycrystalline structure, a multi-phase crystalline structure, a mixed-phase crystalline structure, a columnar crystalline structure, and a micro-crystalline structure.

18. A memory device, comprising:
a first terminal structure;
a second terminal structure; and
a re-writeable non-volatile two-terminal memory element electrically in series with the first and second terminal structures and operative to store at least one-bit of data as a plurality of conductivity profiles that are retained in the absence of electrical power, the memory element including
an electrically insulating high-k dielectric material in contact with the first terminal structure and including a first thickness configured for electron tunneling when a voltage for data operations is applied across the first and second terminal structures, and
a conductive metal oxide (CMO) including mobile oxygen ions and made from a multiple B-site perovskite material including a plurality of perovskite unit cells, the CMO is in contact with the electrolytic insulator and with the second terminal structure,
the multiple B-site perovskite material includes a form $A_X(B_1,B_2)_Y O_Z$, where $A_X$ represents one or more elements selected from the group consisting of lanthanum, cerium, praseodymium, neodymium, calcium, strontium, and barium that are positioned at A-sites in the plurality of perovskite unit cells, $B_1$ represents a first transition metal element positioned at B-sites in a first portion of the plurality of perovskite unit cells, $B_2$ represents a second transition metal element positioned at B-sites in a second portion of the plurality of perovskite unit cells, the second transition metal element is different than the first transition metal element, where O represents oxygen, where X can be any number, where Y is typically 1, and where Z is typically 3.

19. The memory device of claim 18, wherein the first thickness is approximately 35 Å or less.

20. The memory device of claim 18, wherein the electrically insulating high-k dielectric material comprises a material selected from the group consisting of a rare earth oxide, a rare earth metal oxide, yttria stabilized zirconia (YSZ), zirconium oxide, yttrium oxide, hafnium oxide, gadolinium oxide, and erbium oxide.

21. The memory device of claim 18 and further comprising: a non-ohmic device electrically in series with the memory element and with the first and second terminal structures.

22. The memory device of claim 18, wherein the multiple B-site perovskite material includes a structure selected from the group consisting of an amorphous structure, a single crystalline structure, a polycrystalline structure, a multi-phase crystalline structure, a mixed-phase crystalline structure, a columnar crystalline structure, and a micro-crystalline structure.

* * * * *